(12) United States Patent
Sakakura et al.

(10) Patent No.: US 6,287,888 B1
(45) Date of Patent: Sep. 11, 2001

(54) PHOTOELECTRIC CONVERSION DEVICE AND PROCESS FOR PRODUCING PHOTOELECTRIC CONVERSION DEVICE

(75) Inventors: Masayuki Sakakura; Yasuyuki Arai, both of Kanagawa; Shunpei Yamazaki, Tokyo, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/219,722

(22) Filed: Dec. 23, 1998

(30) Foreign Application Priority Data

Dec. 26, 1997 (JP) .................................................. 9-369413
Jan. 12, 1998 (JP) ................................................. 10-018097
Jan. 12, 1998 (JP) ................................................. 10-018099
Jan. 12, 1998 (JP) ................................................. 10-018100

(51) Int. Cl.[7] .................................................. H01L 21/00
(52) U.S. Cl. .............................................. 438/96; 438/97
(58) Field of Search ........................... 438/96, 97, 479, 438/485, 486

(56) References Cited

U.S. PATENT DOCUMENTS

| | | | |
|---|---|---|---|
| 4,410,558 | * 10/1983 | Izu | 438/62 |
| 4,492,605 | 1/1985 | Ishihara et al. | |
| 4,519,339 | 5/1985 | Izu et al. | |
| 4,624,862 | 11/1986 | Yang et al. | |
| 4,737,379 | * 4/1988 | Hudgens | 427/575 |
| 5,164,322 | * 11/1992 | Yamazaki | 438/73 |
| 5,427,961 | * 6/1995 | Takenouchi | 438/96 |
| 5,716,480 | * 2/1998 | Matsuyama | 136/249 |
| 5,736,431 | * 4/1998 | Shinohara | 438/96 |

OTHER PUBLICATIONS

Specification and drawings for 09/235,126, "Method and Apparatus for Manufacturing A Photoelectric Conversion device", Filed Jan. 21, 1999, pp. 1–40 plus drawings, Masayuki Sukaura et al.

* cited by examiner

Primary Examiner—John F. Niebling
Assistant Examiner—Stacy Whitmore
(74) Attorney, Agent, or Firm—Eric J. Robinson; Nixon Peabody LLP

(57) ABSTRACT

The productivity of a photoelectric conversion device is increased by separately conducting a step of forming a microcrystalline semiconductor film and an amorphous semiconductor film without adding an impurity gas.

In a process for producing a photoelectric conversion device comprising a substrate having thereon one or plural unit cells comprising a first electrode, a photoelectric conversion layer, and a second electrode laminated with each other, the photoelectric conversion device is produced by conducting a step of forming a first electrode, a step of forming a first microcrystalline semiconductor film without adding an n type or p type conductive type determining impurity element, a step of forming a substantially intrinsic amorphous semiconductor film, and a step of forming a second microcrystalline semiconductor film without adding an n type or p type conductive type determining impurity element, by a plasma CVD method, and after the step of for forming the second electrode, conducting a step of injecting a p type conductive type determining impurity element from the surface of the second electrode to the second microcrystalline semiconductor film, followed by heating.

33 Claims, 8 Drawing Sheets

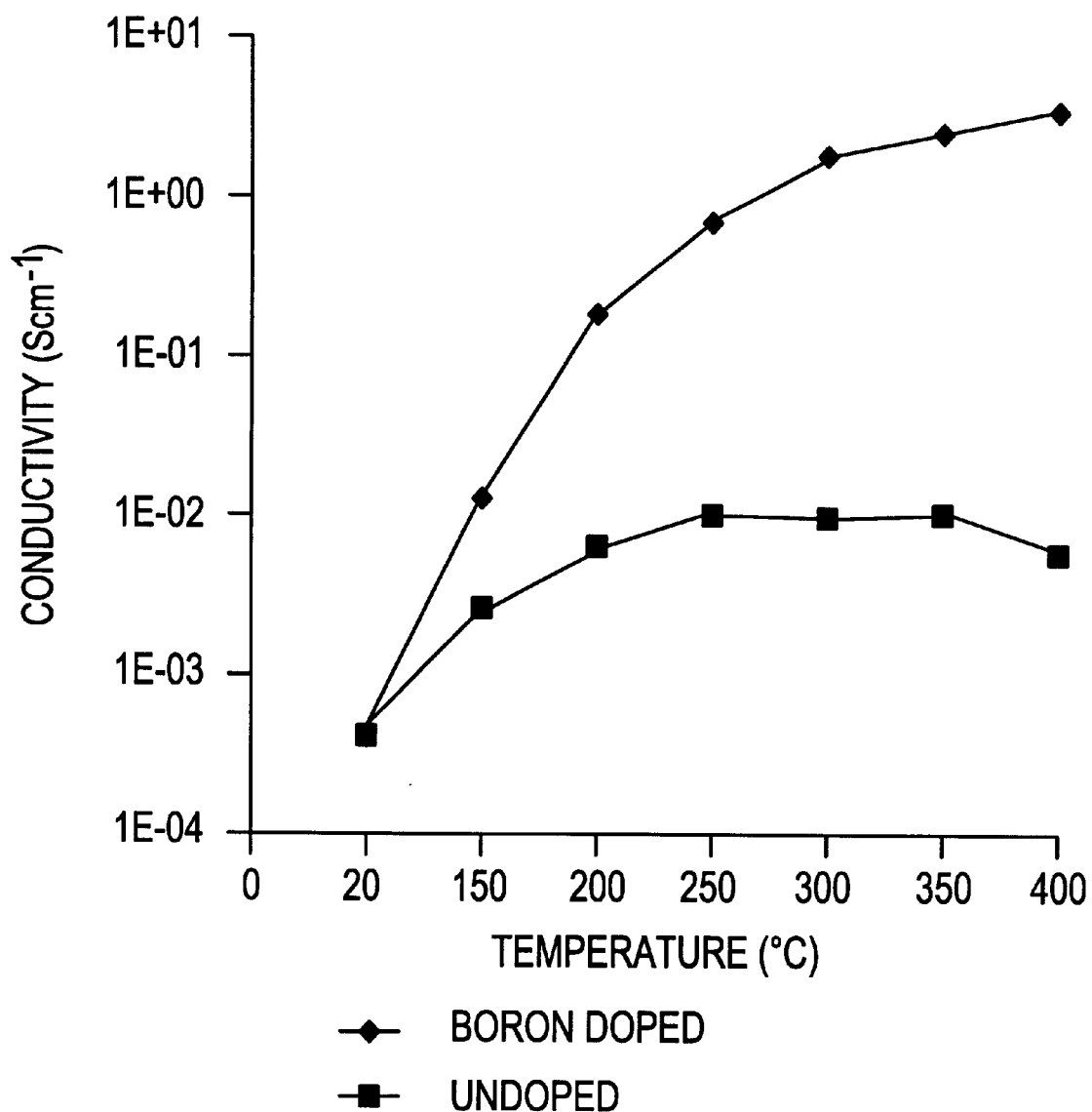

PHOTOELECTRIC CONVERSION DEVICE AND PROCESS FOR PRODUCING PHOTOELECTRIC CONVERSION DEVICE

FIELD OF THE INVENTION

The present invention relates to a photoelectric conversion device, which generates photoelectromotive force by irradiation of light, and a process for producing a photoelectric conversion device. The photoelectric conversion device herein involves various photoelectric conversion devices, such as a solar cell, an image sensor, a photo sensor, as specific application fields.

BACKGROUND OF THE INVENTION

As a photoelectric conversion device using an amorphous semiconductor film as a photo active layer, a solar cell, an image input sensor (image sensor) and an photo sensor have been practically used. Particularly, a solar cell using an amorphous silicon film has been known as a power source of a desk calculator, and has been widely used.

An amorphous silicon film has characteristic features, in comparison to a crystalline silicon material, in that a film having a large area can be produced at a low temperature of 400° C. or lower, and the thickness that is sufficient to absorb light as a photoelectric conversion layer is as thin as about 1 $\mu$m. Therefore, saving of the silicon resource and the energy required for its production can be expected, and it has attracting attention as a material of low cost in comparison to the conventional materials.

A diode structure having a pin junction has been generally used in the field of a solar cell, an image sensor and a photo sensor, for improving photoelectric conversion efficiency and photo response property. While p type, i type and n type layers all can be formed with amorphous silicon films, it has been known that in order to obtain good photoelectric conversion characteristics, the p type and n type semiconductor layers are formed with microcrystalline silicon films. This is because as the photoelectric conversion is mainly performed in the i type layer by light absorption, the p type and n type layers preferably have high light transmission property and is preferably formed with a material having high conductivity to attain good contact with an electrode. A microcrystalline silicon film has low light absorption loss and high conductivity, and is suitable as the material for the p type and n type layers.

An amorphous silicon film is produced by a chemical accumulation process using glow discharge plasma under reduced pressure (plasma CVD process). A plasma CVD apparatus, which is composed of a reaction chamber, an evacuation means for maintaining the reaction chamber under reduced pressure, a gas introducing means for introducing a raw material gas, a means for generating glow discharge plasma in the reaction chamber, and a means for holding and heating a substrate, is used. While silane ($SiH_4$) is generally used as the raw material gas, disilane ($Si_2H_6$) gas can also be used. The raw material gases may be after diluting with hydrogen ($H_2$) gas.

A microcrystalline silicon film is produced by using a mixed gas of $SiH_4$ gas and $H_2$ gas, as a raw material gas, under the conditions in that a diluting ratio of the $H_2$ gas is higher than the $SiH_4$ gas. It has been known that a microcrystalline silicon film, to which no impurity element determining the conductive type, p type or n type, is added, exhibits n type conductivity. In general, an impurity gas containing an element determining the conductive type, p type or n type, is added on formation of the film to further improve the conductivity and to control the conductive type of p type or n type.

In the field of semiconductors, elements represented by boron (B), aluminum (Al), gallium (Ga) and indium (In), which belong to the IIIb group in the periodic table, have been known as an element determining p type conductivity, and phosphorous (P), arsenic (As) and antimony (Sb), which belong to the Vb group in the periodic table, have been known as an element determining n type conductivity. In the general plasma CVD process, an impurity gas represented by $B_2H_6$ and $PH_3$ is mixed with the raw material gas on the film formation. The addition amount of the impurity gas added is generally about from 0.1 to 5% relative to $SiH_4$, and about 10% at most.

Because the microcrystalline silicon film and the amorphous silicon film have a low process temperature, an organic resin material can be used as a material for a substrate of a photoelectric conversion device, in addition to a glass material.

In the basic process for production of a solar cell and an image sensor formed on a substrate, a first electrode is formed on the substrate, a photoelectric conversion layer composed of a pin junction is formed on the first electrode in intimate contact therewith, and a second electrode is accumulated thereon. In the formation of the pin junction, the process is continued without breaking vacuum to improve the characteristics of the junction boundary.

At this time, it has been known that when the impurity gas is added to the raw material gas to form a p type or n type semiconductor film, a slight amount of the impurity gas and its reaction product adhere on the reaction chamber and a discharge electrode, which is a part of the means for generating glow discharge plasma. When an i type amorphous silicon film, which is substantially intrinsic, is continuously formed without addition of any impurity gas, there is a problem in that the residual impurity is released and incorporated into the i type amorphous silicon film. The substantially intrinsic i type silicon film is produced to have a defect density in the film of $1 \times 10^{16}$ per cubic centimeter, and thus if the impurity element is incorporated in a concentration of from several tens to several hundreds ppm, it forms an impurity level to change the characteristics of the film.

In order cope with such a problem, a plasma CVD apparatus of separated multichamber type has been developed, in which plural reaction chambers are provided, which are separated from each other by a gate valve provided between the reaction chambers. Therefore, in order to produce the pin junction according to the conventional process, at least three reaction chambers for forming the p type, i type and n type semiconductor layers.

As a result, a gas introducing means for introducing $SiH_4$, $H_2$, $B_2H_6$ and $PH_3$, an evacuation means, and a glow discharge plasma generation means must be provided in each of the reaction chambers, and thus the constitution of the apparatus becomes complicated and exaggerated. The maintenance of the apparatus requires much labor, accordingly.

From the standpoint of the production process, after a semiconductor film of one conductive type is formed, the substrate must be moved from one reaction chamber to another reaction chamber, and the introduction and evacuation of the reaction gas must be conducted. These procedures must be repeated in order. Therefore, the reduction in time required to form the photoelectric conversion layer is naturally limited. Even when a technique of high-speed film formation is employed to reduce the time required for forming a film, the time required for transfer of the substrate and introduction and evacuation of the gas becomes a bar in reduction of the production time.

In the conventional technical field of a solar cell, it has been known that the concentration of a p type impurity in a p/i boundary of a photoelectric conversion layer is continuously changed to form a continuous boundary for improvement in junction characteristics. In order to realize such a technique in the conventional process, a gas containing a slight amount of a p type impurity element must be precisely controlled by using a computer.

SUMMARY OF THE INVENTION

In order to solve the above-described problems, the invention provides a, process for producing a photoelectric conversion layer, in which a step of forming an amorphous semiconductor layer and a microcrystalline semiconductor layer, and a step of adding an impurity to the microcrystalline semiconductor layer to control the conductive type are separated, and also provides a photoelectric conversion device produced by the process.

As a result of experimentation by the inventors, it has been found that a p type or n type microcrystalline silicon film can be obtained, in the conventional film forming process by using the plasma CVD process, by forming a microcrystalline silicon film without adding a p type or n type conductive type determining impurity element, and then injecting the p type or n type conductive type determining impurity element to the microcrystalline silicon film by using an ion doping method, followed by heat activation, as a method for controlling the conductive type of the microcrystalline silicon film. While it has been known that a microcrystalline silicon film containing no p type or n type conductive type determining impurity element exhibits n type conductivity, the conductivity is further increased by conducting the heat activation step.

Therefore, in the invention, the addition of the p type or n type conductive type determining impurity element is not required in the step of forming a p type or n type microcrystalline silicon film. Thus, in the steps of forming a p type or n type microcrystalline silicon film and a substantially intrinsic amorphous silicon film (i type amorphous silicon film), the contamination by the impurity described above cannot be ignored, and the films can be continuously formed in one reaction chamber.

According to the invention, microcrystalline silicon films having p type conductivity and n type conductivity can be obtained by the step of injecting a p type conductive type determining impurity element to a microcrystalline silicon film, and a step of heat treating such a microcrystalline silicon film added with the p type conductive type determining impurity element and a microcrystalline containing no p type or n type conductive type determining impurity element. That is, there is no necessity of using an n type conductive type determining impurity element.

The invention is characterized in that in the production process of a photoelectric conversion layer represented by the plasma CVD process, the process comprises, in order to improve the production efficiency, a step of forming, in intimate contact with a first electrode, a photoelectric conversion layer comprising first and second microcrystalline semiconductor films produced without adding p type or n type conductive type determining impurity element, and a substantially intrinsic amorphous semiconductor film; a step of forming a second electrode in intimate contact with the photoelectric conversion layer; and a step of injecting a p type conductive type determining impurity element to a surface of the second electrode, followed by heating.

The invention is characterized in that a photoelectric conversion device is produced by a process comprising a step of forming a photoelectric conversion layer comprising a first microcrystalline semiconductor film, a substantially intrinsic amorphous semiconductor film and a second microcrystalline sermconductor film, and a step of injecting a p type conductive type determining impurity element from a surface of a second electrode provided on the second microcrystalline semiconductor film to the second microcrystalline semiconductor film and the vicinity of a boundary of the substantially intrinsic amorphous semiconductor film and the second microcrystalline semiconductor film, followed by heating.

The invention is characterized in that, in order to prevent contamination of impurity gas in the plasma CVD process, a photoelectric conversion layer is produced by forming first and second microcrystalline semiconductor films without adding a p type or n type conductive type determining impurity element, and heating the first microcrystalline semiconductor film and the second microcrystalline semiconductor film, to which a p type conductive type determining impurity element is injected, to obtain microcrystalline semiconductor films having p type conductivity and n type conductivity.

The invention is characterized in that, in order to improve the productivity in the production process of a photoelectric conversion layer represented by the plasma CVD process, the process comprises a step of forming a photoelectric conversion layer comprising first and second microcrystalline semiconductor films produced without adding a p type or n type conductive type determining impurity element, and a substantially intrinsic amorphous semiconductor film; and a step of injecting a p type conductive type determining impurity element into the first or second microcrystalline semiconductor film, followed by heating so as to be thermally activated.

The invention is characterized in that, in order to improve the productivity in the production process of a photoelectric conversion layer, a step of forming a first microcrystalline semiconductor film without adding a p type or n type conductive type determining impurity element, a step of forming a substantially intrinsic amorphous semiconductor film, and a step of forming a second microcrystalline semiconductor film without adding a p type or n type conductive type determining impurity element are conducted from the side of a first electrode; and then a p type conductive type determining impurity element is injected to the second microcrystalline semiconductor film, followed by heating. At this time, the p type impurity element may be injected to the second microcrystalline semiconductor film, and the vicinity of the boundary between the second microcrystalline semiconductor film and the substantially intrinsic amorphous semiconductor film.

The invention is characterized in that, in order to improve the productivity in the production process of a photoelectric conversion layer, a step of forming a first microcrystalline semiconductor film without adding a p type or n type conductive type determining impurity element, a step of forming a substantially intrinsic amorphous semiconductor film, and a step of forming a second microcrystalline semiconductor film without adding a p type or n type conductive type determining impurity element are conducted from the side of a first electrode; and after forming a second electrode, a p type conductive type determining impurity element is injected to the second microcrystalline semiconductor film, followed by heating. At this time, the p type impurity element may be injected to the second microcrystalline semiconductor film, and the vicinity of the boundary between the second microcrystalline semiconductor film and the substantially intrinsic amorphous semiconductor film.

In the most preferred embodiment of the invention, a microcrystalline silicon film is used as the microcrystalline semiconductor film, and an amorphous silicon film is used as the amorphous semiconductor film. As the amorphous semiconductor film, an amorphous silicon carbide film, an amorphous silicon germanium film, and an amorphous silicon tin film can also be used.

In one preferred embodiment of the invention, an ion doping method is employed as the method for injecting a p type conductive type determining impurity element from the surface of the second electrode.

In one embodiment of the invention, the process is characterized by comprising a step of forming a first electrode on a substrate, a step of forming a first microcrystalline semiconductor film without adding an n type or p type conductive type determining impurity element, a step of forming a substantially intrinsic amorphous semiconductor film, a step of forming a second microcrystalline semiconductor film without adding an n type or p type conductive type determining impurity element, a step of injecting a p type conductive type determining impurity element to the second microcrystalline semiconductor film, a step of subjecting the first and second microcrystalline semiconductor films and the substantially intrinsic amorphous semiconductor film to a heat treatment, and a step of forming a second electrode.

In another embodiment of the invention, the process is characterized by comprising a step of forming a first electrode on a substrate, a step of forming a first microcrystalline semiconductor film without adding an n type or p type conductive type determining impurity element, a step of forming a substantially intrinsic amorphous semiconductor film, a step of forming a second microcrystalline semiconductor film without adding an r type or p type conductive type determining impurity element, a step of injecting a p type conductive type determining impurity element to the second microcrystalline semiconductor film, and the vicinity of the boundary between the second microcrystalline semiconductor film and the substantially intrinsic amorphous semiconductor film, a step of subjecting the first and second microcrystalline semiconductor films and the substantially intrinsic amorphous semiconductor film to a heat treatment, and a step of forming a second electrode.

In another embodiment of the invention, the process is characterized by comprising a step of forming a first electrode on a substrate, a step of forming a second microcrystalline semiconductor film without adding an n type or p type conductive type determining impurity element, a step of injecting a p type conductive type determining impurity element to the second microcrystalline semiconductor film, a step of forming a substantially intrinsic amorphous semiconductor film, a step of forming a first electrode on a substrate, a step of forming a first microcrystalline semiconductor film without adding an n type or p type conductive type determining impurity element, a step of subjecting the first and second microcrystalline semiconductor films and the substantially intrinsic amorphous semiconductor film to a heat treatment, and a step of forming a second electrode.

Another embodiment of the invention is a photoelectric conversion device comprising a first electrode provided on a substrate, a substantially n type first microcrystalline semiconductor film provided in intimate contact with the first electrode, a substantially intrinsic amorphous semiconductor film provided in intimate contact with the first microcrystalline semiconductor film, a second microcrystalline semiconductor film containing a p type conductive type determining impurity element provided in intimate contact with the substantially intrinsic amorphous semiconductor film, and a second electrode provided in intimate contact with the second microcrystalline semiconductor film.

Another embodiment of the invention is a photoelectric conversion device comprising a first electrode provided on a substrate, a substantially n type first microcrystalline semiconductor film provided in intimate contact with the first electrode, a substantially intrinsic amorphous semiconductor film provided in intimate contact with the first microcrystalline semiconductor film, a second microcrystalline semiconductor film provided in intimate contact with the substantially intrinsic amorphous semiconductor film, and a second electrode provided in intimate contact with the second microcrystalline semiconductor film, a p type conductive type determining impurity element is contained in the second microcrystalline semiconductor film, and the vicinity of the boundary between the substantially intrinsic amorphous semiconductor film and the second microcrystalline semiconductor film.

Another embodiment of the invention is a photoelectric conversion device comprising a first electrode provided on a substrate, a second microcrystalline semiconductor film containing a p type conductive type determining impurity element provided in intimate contact with the first electrode, a substantially intrinsic amorphous semiconductor film provided in intimate contact with the second microcrystalline semiconductor film, a first microcrystalline semiconductor film provided in intimate contact with the substantially intrinsic amorphous semiconductor film, and a second electrode provided in intimate contact with the first semiconductor film.

According to the invention, the addition of a p type or n type conductive type determining impurity element is not necessary in comparison to the conventional process for forming a p type or n type microcrystalline semiconductor film. Thus, in the process for forming a p type or n type microcrystalline semiconductor film and a substantially intrinsic i type amorphous semiconductor film, the above-described contamination of impurities must not be considered, and for example, the films may be continuously formed in one chamber for film formation. Specifically, as a p type and n type microcrystalline silicon films and a substantially intrinsic silicon film are produced by using only $SiH_4$ gas or $Si_2H_6$ gas, and $H_2$ gas, they can be formed with one glow plasma generation means provided in one reaction chamber. Furthermore, a p type and n type microcrystalline silicon films and a substantially intrinsic silicon film can be continuously formed with maintaining glow discharge plasma.

According to the invention, because the introduction of an impurity gas in the formation process of a p type or n type microcrystalline semiconductor film and a substantially intrinsic amorphous semiconductor film is not necessary, and the influence of the contamination of the impurity in the plasma CVD apparatus can be reduced, the use of only one reaction chamber is substantially sufficient, and the constitution of the plasma CVD apparatus can be simplified. Furthermore, the time required for transportation of a substrate, and the time required for introduction and evacuation of the gas can be reduced. On the other hand, even when a conventional separated multichamber type apparatus is employed, an impurity gas must not be introduced in the film formation process to prevent contamination of impurities in the film formation process, and thus plural substrate can be simultaneously processed in plural reaction chaffers.

Therefore, according to the invention, microcrystalline semiconductor films exhibiting a p type conductivity and n type conductivity, respectively, and a substantially intrinsic amorphous semiconductor film can be obtained by a step of forming a first microcrystalline semiconductor film, a step of forming a substantially intrinsic amorphous semiconductor film, a step of forming a second microcrystalline semiconductor film, a step of injecting a p type conductive type determining impurity element to the second microcrystalline semiconductor film, and a step of heating the first and second microcrystalline semiconductor films and the substantially intrinsic amorphous semiconductor film, and thus a pin junction can be produced. A microcrystalline silicon film, to which no p type or n type conductive type determining impurity element is added, exhibits n type conductivity by itself. It has been found that even when a pin junction is formed by using such a microcrystalline silicon film having n type conductivity, a good photoelectric conversion layer can be obtained. Therefore, an n type impurity element, which is used in the conventional technique, must not be used.

In a preferred embodiment of the invention, because the first and second microcrystalline silicon films and the substantially intrinsic amorphous silicon film can be produced with $SiH_4$ gas and $H_2$ gas, there is no necessity of changing the gases on formation of each of the films. Therefore, the time required for transporting the substrate from a reaction chamber to another reaction chamber, and the time required for introduction and evaluation of the gas, which are needed in the conventional process, are not necessary, and thus the process performance can be enhanced.

According to the invention, the p type and n type microcrystalline silicon films and the substantially intrinsic amorphous silicon film can be simultaneously or separately produced in the reaction chambers of a plasma CVD apparatus having plural reaction chambers, and thus the process performance can be enhanced.

Furthermore, by injecting a p type conductive type determining impurity element from the surface of the second microcrystalline semiconductor film by using the ion doping method, the concentration distribution of the p type impurity in the direction of the film thickness can be easily controlled.

The invention can be applied to a photoelectric conversion device using an organic resin substrate selected from polyethyleneterephthalate, polyethylenenaphthalate, polyethersulfone, polyimide and aramid.

BRIEF DESCRIPTION OF THE DRAWINGS

FIG. 8 is a graph showing change of the conductivity depending on the temperature of the heat treatment of the microcrystalline silicon films exhibiting p type or n type conductivity obtained according to the invention.

DESCRIPTION OF THE PREFERRED EMBODIMENTS

The invention will be further explained below with reference to examples, but the invention is not construed as being limited to the examples.

EXAMPLE 1

An example of the invention will be described according to the production process of a solar cell.

FIGS. 1A to 1E show the production process of a solar cell according to this example as cross sectional structures. A substrate 101 has a flattened surface and is enough to have a resisting temperature of about 450° C. at most. In this example, a commercially available non-alkali glass was used.

Figure 1A:
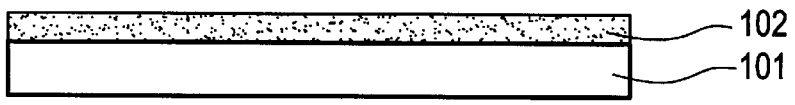
FIGS. 1A to 1E are schematic cross sectional views showing a production process of a photoelectric conversion device according to one example.

A first electrode 102 is formed on the surface of the substrate 101. The first electrode 102 was formed by a known method represented by a vacuum vapor deposition method and a sputtering method. It is preferred that the first electrode 102 is formed with a light reflective metallic electrode selected from Ag, Ti, Cr, Ni and Pt, or a two-layered electrode comprising Al laminated with one of the above-described metallic materials. The necessary thickness thereof is about from 100 to 300 nm, but a thickness outside this range can be used irrespective to the constitution of the invention. In this example, Ti was formed in a thickness of 300 nm by a sputtering method. (FIG. 1A)

Figure 1B:
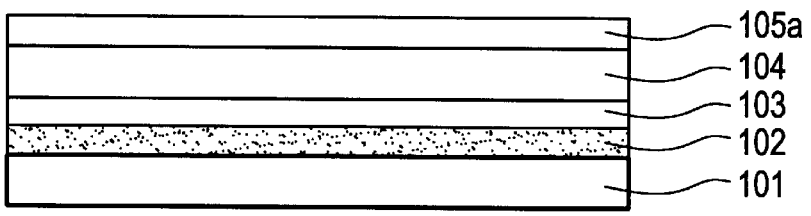

Microcrystalline silicon layers and an amorphous silicon layer to be a photoelectric conversion layer was formed on the surface of the first electrode 102. A first microcrystalline silicon layer 103 was formed by a plasma CVD process without: adding a p type or n type conductive type determining impurity element; a substantially intrinsic amorphous silicon layer 104 was formed by a plasma CVD process; and a second microcrystalline silicon layer 105a was formed by a plasma CVD process without adding a p type or n type conductive type determining impurity element. In this step, the film formation was continuously conducted in one reaction chamber using one discharge means of a plasma CVD apparatus. The reason why such a formation process is realized is that the film formation process according to the invention uses only $SiH_4$ gas and $H_2$ gas as raw material gases. (FIG. 1B)

In this step, after forming the first microcrystalline silicon layer 103, a substrate may be taken out from the plasma CVD apparatus, and then phosphorus may be injected thereto by an ion doping method described later.

In this step, the first microcrystalline silicon layer 103 and the second microcrystalline silicon layer 105a formed without adding a p type or n type conductive type determining impurity element were formed under the same conditions. Specifically, the film formation was conducted at an $SiH_4$ flow amount of 2 sccm, an $H_2$ flow amount of 200 sccm, a pressure of 133 Pa, and an RF (13.56 MHz) electric power of 120 mW/cm$^2$. The film formation conditions of the microcrystalline silicon layer are basically known techniques and are not limited to the above-described conditions. As examples of the ranges of the film formation conditions, the ratio of $SiH_4/H_2$ may be from 1/30 to 1/100, the pressure may be from 5 to 266 Pa, the RF power density may be from 10 to 250 mW/cm$^2$, and the substrate temperature may be from 80 to 300° C. The thickness of the first microcrystalline silicon layer 103 may be from 10 to 80 nm, and the thickness of the second microcrystalline silicon layer 105a may be from 5 to 50 nm. In this example, the thickness of the first microcrystalline silicon layer 103 was 30 nm, and the thickness of the second microcrystalline silicon layer 105a was 25 nm.

The substantially intrinsic amorphous silicon layer 104 was formed at an $SiH_4$ flow amount of 40 sccm, an $H_2$ flow amount of 360 sccm, a pressure of 133 Pa, and an RF (13.56 MHz) electric power of 48 mW/cm$^2$. The substrate temperature at this time was maintained at 160° C. The film formation conditions of the amorphous silicon layer are basically known techniques and are not limited to the above-described conditions. As examples of the ranges of the film formation conditions, the ratio cf $H_2$ gas with respect to $SiH_4$ gas may be from 0 to 90%, the pressure may be from 5 to 266 Pa, the RF power density may be from 5 to 100 mW/cm$^2$, and the substrate temperature may be from 80 to 350° C. The thickness is preferably from 100 to 2,000 nm. In this example, the thickness was 1,000 nm.

Instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

Figure 1C:
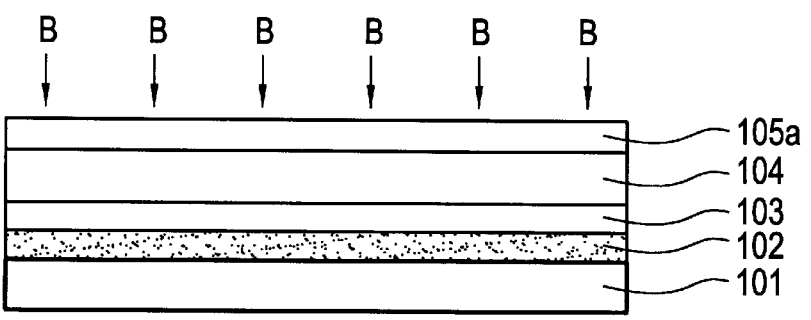

The step of forming a p type microcrystalline silicon film 105b by introducing a p type conductive type determining impurity element into the second microcrystalline silicon film 105a is conducted by the ion doping method and the subsequent heat treatment. Typically, an element of the IIIb group of the periodic table, such as boron (B), aluminum (Al), gallium (Ga) and indium (In), may be added as an impurity controlling the valence electron to p type, to the microcrystalline silicon film. In the plasma doping method, a gas of a hydrogenated compound, a chloride or a fluoride of the impurity elements is formed into plasma, and the thus-generated impurity element is ionized to be injected to the substrate by applying an electric field in the direction, by which the ion is accelerated toward the substrate. In this example, $B_2H_6$ gas was used. The dose amount may be from $2.0\times10^{13}$ to $5.0\times10^{15}$ per square centimeter. In this example the dose amount was $1.0\times10^{14}$ per square centimeter. (FIG. 1C)

In the plasma doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 keV. In this example, the accelerated voltage was 10 keV. When B was injected under the conditions of a dose amount of $1.0\times10^{14}$ per square centimeter and an accelerated voltage of 10 keV, the concentration of B injected into the film was measured by the secondary ion mass spectrometry, and a concentration of $5\times10^{19}$ per cubic centimeter as a concentration at a peak value.

As a result of the experiment, the amount of B injected into the film was proportional to the dose amount, and when the dose amount was $1.0\times10^{15}$ per square centimeter, the concentration was $5\times10^{20}$ per cubic centimeter.

Furthermore, the p type impurity element may be injected to the second microcrystalline silicon film and the region of the substantially intrinsic amorphous sit con film in contact with the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p type impurity element must be precisely controlled by using a computer to obtain such density gradient. In the invention, only the accelerated voltage is controlled in the process of the plasma doping method to obtain the density gradient.

Figure 1D:
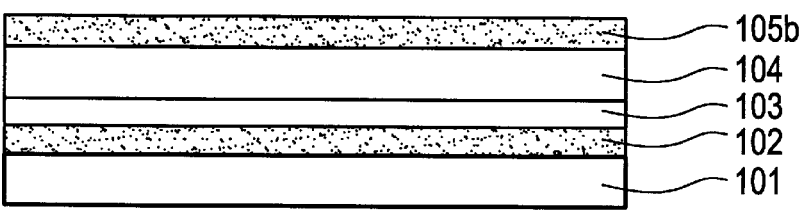

Since B element injected as it is does not function as a p type impurity element, a step of activation by a heat treatment is necessary. The heat treatment can be conducted in the air, a nitrogen atmosphere or a hydrogen atmosphere at a temperature of from 200 to 450° C., preferably from 300 to 400° C. In this example, the heat treatment was conducted at 300° C. for 2 hours. (FIG. 1D)

Figure 7:
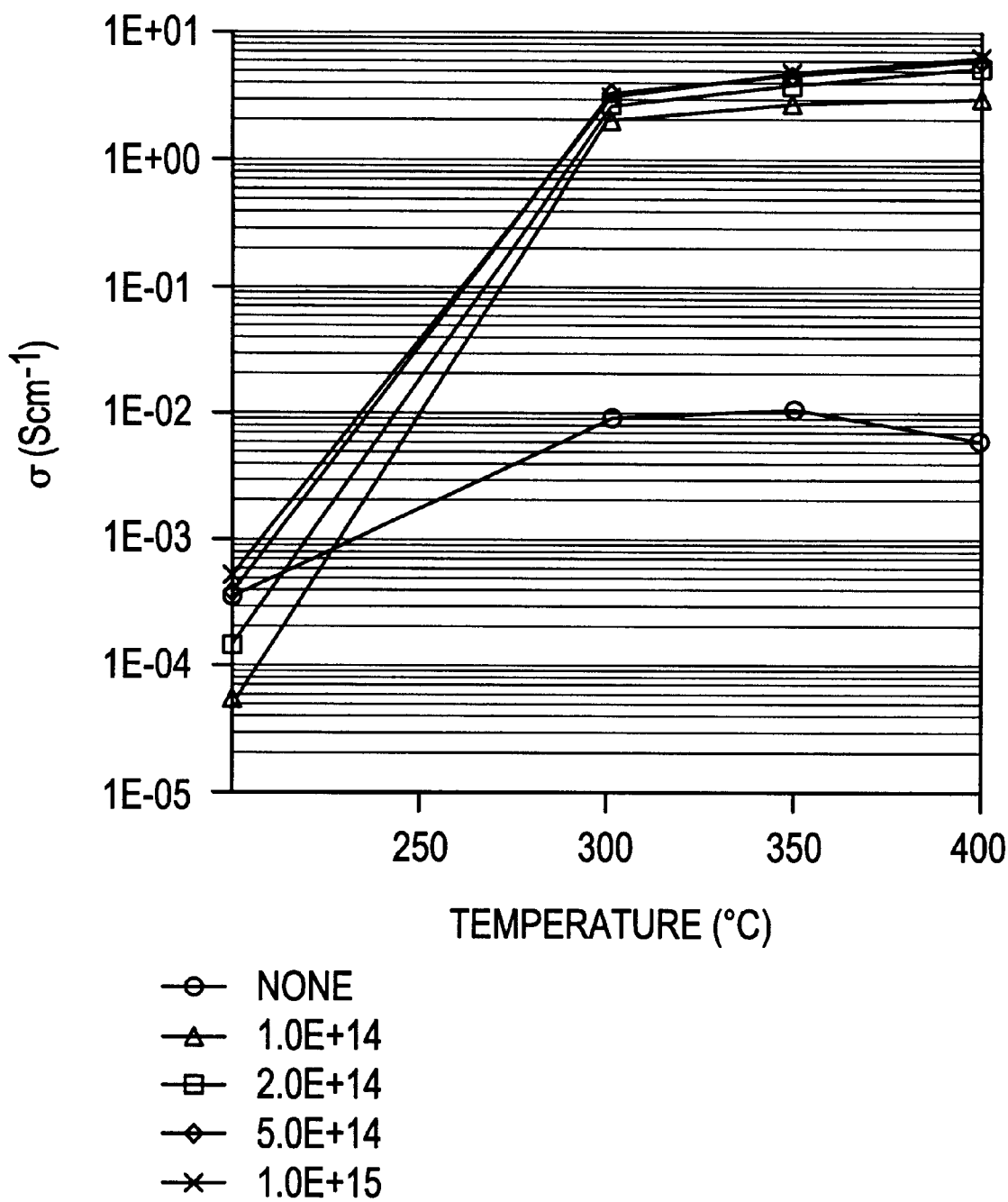
FIG. 7 is a graph showing change of the conductivity depending on the temperature of the heat treatment of the microcrystalline silicon films exhibiting p type or n type conductivity obtained in the examples.

Results of evaluation of the change of the conductivity of the microcrystalline silicon film formed on a glass substrate are shown in FIG. 7. It was confirmed that the conductivity immediately after the film formation was about $5\times10^{-4}$ S/cm, and it was increased to from $2\times10^{-0}$ to $3\times10^{-0}$ S/cm by a heat treatment at 300° C. Furthermore, it was confirmed that the conductivity of the film, to which no impurity element was injected by the ion doping method, was increased to about $1.1\times10^{-2}$ S/cm.

Figure 1E:
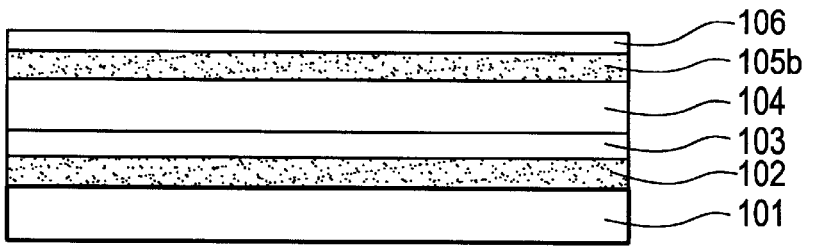

After the above-described step, a second electrode 106 was formed on the second microcrystalline silicon film 105b. The second electrode 106 can be formed by the known method, such as the vacuum vapor deposition method and the sputtering method. Specifically, the second electrode 106 may be $SnO_2$, ZnO or an ITO film. In this example, an ITO film was formed to have a thickness of 70 nm by the sputtering method. (FIG. 1E)

A solar cell according to the invention was obtained through the above-described steps. The process for producing a solar cell in this example comprised a step of forming a first electrode, a step of forming a first microcrystalline silicon film, a step of forming a substantially intrinsic amorphous silicon film, a step of forming a second microcrystalline silicon film, a step of injecting a p type conductive type determining impurity element to the second microcrystalline silicon films, a step of subjecting the first and second microcrystalline silicon films and the substantially intrinsic amorphous silicon film to a heat treatment, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 2

The invention will be described with reference to the production process of a solar cell having a structure in which light is incident from the side of a substrate.

FIGS. 2A to 2F show the production process of a solar cell according to this example as cross sectional structures. A substrate 201 has a flattened surface and is enough to have a resisting temperature of about 450° C. at most. In this example, a commercially available non-alkali glass was used.

Figure 2A:
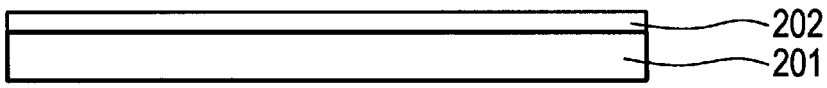
FIGS. 2A to 2F are schematic cross sectional views showing a production process of a photoelectric conversion device according to another example.

A first electrode 202 is formed on the surface of the substrate 201. The first electrode 202 was formed by a known method represented by a vacuum vapor deposition method and a sputtering method. The first electrode 202 is formed with a metal oxide material selected from $SnO_2$, $In_2O_3$ and ZnO. The necessary thickness thereof is about from 60 to 120 nm taking the interference effect of light into consideration, but a thickness outside this range can be used irrespective to the constitution of the invention. (FIG. 2A)

Figure 2B:
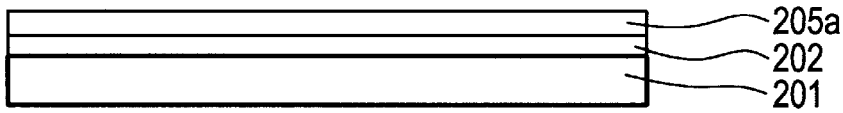

A second microcrystalline silicon layer 205a was formed on the surface of the first electrode 202 without adding a p type or n type conductive type determining impurity element by the plasma CVD method. The second microcrystalline silicon layer 205a without adding a p type or n type conductive type determining impurity element was formed under the conditions of an $SiH_4$ flow amount of 2 sccm, an $H_2$ flow amount of 200 sccm, a pressure of 133 Pa, and an RF (13.56 MHz) electric power of 120 mW/cm$^2$. The substrate temperature at this time was maintained at 160° C. The conditions for forming the microcrystalline silicon film are basically the conventional technique, and they are not limited to the above-described film formation conditions. Examples of applicable conditions are that the ratio $SiH_4/H_2$ may be from 1/30 to 1/100, the pressure may be from 5 to 266 Pa, the RF electric power density may be from 10 to 250 mW/cm$^2$, and the substrate temperature may be from 80 to 300° C. The thickness of the second microcrystalline silicon layer 205a was formed to have a thickness of from 10 to 80 nm. (FIG. 2B)

Figure 2C:
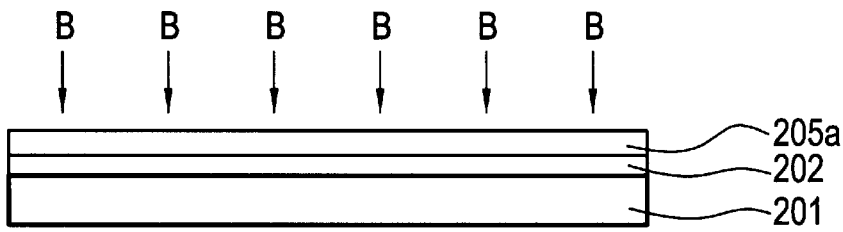

After forming the second microcrystalline silicon film 205a, the sample was once taken out from the reaction chamber of the plasma CVD apparatus, and a step of injecting a p type conductive type determining impurity element was conducted by the ion doping method and a subsequent heat treatment. As an impurity that can control the valence electron of the microcrystalline silicon film to p type, an element of the group IIIb of the periodic table, such as boron (B), aluminum (Al), gallium (Ga) and indium (In), may be added. In the plasma doping method, a gas of a hydrogenated compound, a chloride or a fluoride of the impurity elements is formed into plasma, and the thus-generated impurity element is ionized to be injected to the substrate by applying an electric field in the direction, by which the ion is accelerated toward the substrate. In this example, $B_2H_6$ gas was used. The dose amount may be from $2.0 \times 10^{13}$ to $5.0 \times 10^{15}$ per square centimeter. In this example the dose amount was $1.0 \times 10^{14}$ per square centimeter. (FIG. 2C)

A step of forming a substantially intrinsic amorphous silicon film 204 and a first microcrystalline silicon film 207 was conducted. The substantially intrinsic amorphous silicon film 204 was formed by applying an RF (13.56 MHz) electric power of 48 mW/cm$^2$ with maintaining the pressure to 133 Pa at an $SiH_4$ flow amount of 40 sccm and an $H_2$ flow amount of 360 sccm. The substrate temperature at this time was maintained at 160° C. The film formation conditions of the amorphous silicon film are basically the conventional technique, and they are not limited to the above-described conditions. Examples of the applicable conditions include that the ratio of $H_2$ gas with respect to $SiH_4$ gas may be from 0 to 90%, the pressure may be from 5 to 266 Pa, the RF electric power density may be from 5 to 100 mW/cm$^2$, and the substrate temperature may be from 80 to 350° C. The thickness is preferably from 100 to 2,000 nm. In this example, the thickness of the film was 1,000 nm.

Instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn)

Figure 2D:
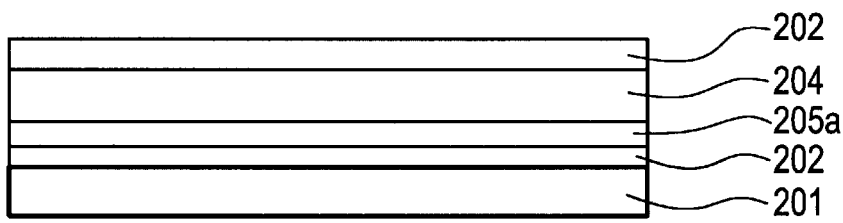

The step of forming the first microcrystalline silicon film 207 was continuously conducted subsequent to the step of forming the substantially intrinsic amorphous silicon film 204. The conditions for the film formation were the same as those in the formation of the second microcrystalline silicon film, and the film formation was conducted by introducing only $SiH_4$ gas and $H_2$ gas into the reaction chamber. (FIG. 2D)

Figure 2E:
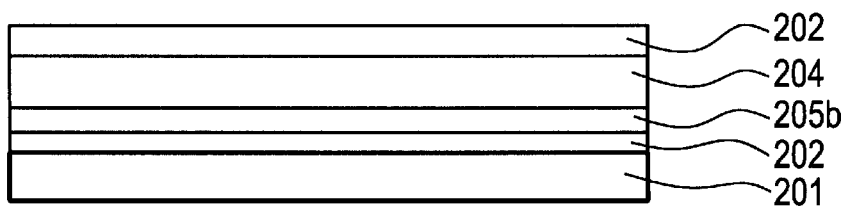

Since the B element introduced into the second microcrystalline silicon film 205a does not function as a p type impurity element as it is, an activation step by a heat treatment is necessary. The heat treatment can be conducted in the air, a nitrogen atmosphere or a hydrogen atmosphere at a temperature of from 200 to 450° C., preferably from 300 to 400° C. In this example, the heat treatment at 300° C. form 2 hours was conducted. At this time, the conductivity of the first microcrystalline silicon film 207 was also increased, and it was confirmed that it exhibit higher n type conductivity. By conducting the heat treatment, a microcrystalline silicon film 205b having p type conductive type was obtained. (FIG. 2E)

Figure 2F:
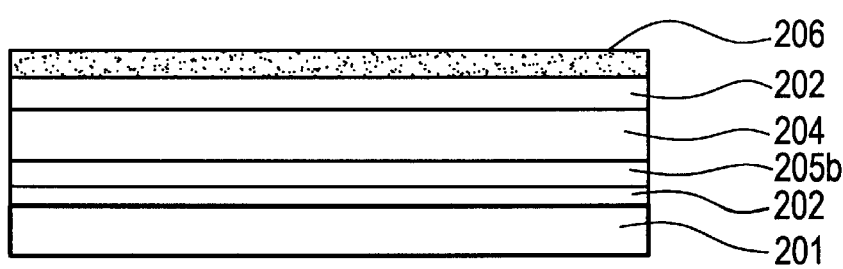

After the above-described step, a second electrode 206 was formed on the first microcrystalline silicon film 207. The second electrode 206 may be formed by a known method represented by the vacuum vapor deposition method and the sputtering method. Specifically, a single film composed of a metallic material, such as Ti, Al, Ag and Cr, or an electrode obtained by laminating plural materials can be used. In this example, Ti was formed into a film having a thickness of 300 nm by the sputtering method. (FIG. 2F)

A solar cell according to the invention was obtained through the above-described steps. The process for producing a solar cell in this example comprised a step of forming a first electrode, a step of forming a first microcrystalline silicon film, a step of forming a substantially intrinsic amorphous silicon film, a step of forming a second microcrystalline silicon film, a step of injecting a p type conductive type determining impurity element to the second microcrystalline silicon film, a step of subjecting the first and second microcrystalline silicon film and the substantially intrinsic amorphous silicon film to a heat treatment, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 3

An example of the invention will be described according to the production process of a solar cell.

FIGS. 1A to 1E show the production process of a solar cell according to this example as cross sectional structures. A substrate 101 has a flattened surface and is enough to have a resisting temperature of about 450° C. at most. In this example, a commercially available non-alkali glass was used.

A first electrode is formed on the surface of the substrate 101. The first electrode 102 was formed by a known method represented by a vacuum vapor deposition method and a sputtering method. It is preferred that the first electrode 102 is formed with a light reflective metallic electrode selected from Ag, Ti, Cr, Ni and Pt, or a two-layered electrode comprising Al laminated with one of the above-described metallic materials. The necessary thickness thereof is about from 100 to 300 nm, but a thickness outside this range can be used irrespective to the constitution of the invention. In this example, Ti was formed in a thickness of 300 nm by a sputtering method. (FIG. 1A)

Microcrystalline silicon layers and an amorphous silicon layer to be a photoelectric conversion layer was formed on the surface of the first electrode. A first microcrystalline silicon layer 103 was formed by a plasma CVD process without adding a p type or n type conductive type determining impurity element; a substantially intrinsic amorphous silicon layer 104 was formed by a plasma CVD process; and a second microcrystalline silicon layer 105a was formed by a plasma CVD process without adding a p type or n type conductive type determining impurity element.

In this example, a plasma CVD apparatus having a load chamber of a substrate, an unload chamber of a substrate, a transfer chamber, and plural reaction chambers provided around the transfer chamber was used. According to the invention, because the first and second microcrystalline silicon films and the substantially intrinsic amorphous silicon film were formed only from $SiH_4$ gas and $H_2$ gas, they could be continuously formed in one chamber without considering the influence of the contamination of a p type or n type impurity gas. Furthermore, by forming the first and second microcrystalline silicon films and the substantially intrinsic amorphous silicon film in each of the plural reaction chamber of the plasma CVD apparatus having the above-described constitution, the productivity could also be increased.

In this step, the first microcrystalline silicon film 103 and the second microcrystalline silicon film 105a formed without adding a p type or n type conductive type determining impurity element were formed under the same conditions. Specifically, the film formation was conducted at an $SiH_4$ flow amount of 2 sccm, an $H_2$ flow amount of 200 sccm, a pressure of 133 Pa, and an RF (13.56 MHz) electric power of 120 mW/cm². The substrate temperature at this time was maintained at 160° C. The conditions for the formation of the microcrystalline silicon film are basically the conventional technique, and they are not limited to the above-described conditions. Examples of the applicable conditions include that the ratio $SiH_4/H_2$ may be from 1/30 to 1/100, the pressure may be from 5 to 266 Pa, the RF electric power may be from 10 to 250 mw/cm², and the substrate temperature may be from 80 to 300° C. The thickness of the first microcrystalline silicon film 103 may be from 10 to 80 nm, and the thickness of the second microcrystalline silicon film 105a may be from 5 to 50 nm. In this example, the thickness of the first microcrystalline silicon film 103 was 30 nm, and the thickness of the second microcrystalline silicon film 105a was 25 nn.

The substantially intrinsic amorphous silicon film 104 was formed at an $SiH_4$ flow amount of 40 sccm, an $H_2$ flow amount of 360 sccm, a pressure of 133 Pa, and an RF (13.56 MHz) electric power of 48 mW/cm². The substrate temperature at this time was maintained at 160° C. The conditions for the formation of the amorphous silicon film are basically the conventional technique, and they are not limited to the above-described conditions. Examples of the applicable conditions include that the ratio of $H_2$ gas with respect to $SiH_4$ gas may be from 0 to 90%, the pressure may be from 5 to 266 Pa, the RF electric power density may be from 5 to 100 mW/cm², and the substrate temperature may be from 80 to 350° C. The thickness of the amorphous silicon film is preferably from 100 to 2,000 nm. In this example, the thickness of the amorphous silicon film was 1,000 nm. (FIG. 1B)

Instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

A step of injecting a p type conductive type determining impurity element into the second microcrystalline silicon film 105a to form a p type microcrystalline silicon film 105b is conducted by the ion doping method and the subsequent heat treatment. Typically, an element of the IIIb group of the periodic table, such as boron (B) aluminum (Al), gallium (Ga) and indium (In), may be added as an impurity controlling the valence electron to p type, to the microcrystalline silicon film. In the plasma doping method, a gas of a hydrogenated compound, a chloride or a fluoride of the impurity elements is formed into plasma, and the thus-generated impurity element is ionized to be injected to the substrate by applying an electric field in the direction, by which the ion is accelerated toward the substrate. In this example, $B_2H_6$ gas was used. The dose amount may be from $2.0\times10^{13}$ to $5.0\times10^{15}$ per square centimeter. In this example the dose amount was $1.0\times10^{14}$ per square centimeter. (FIG. 1C)

In the plasma doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 kev. In this example, the accelerated voltage was 10 keV. When B was injected under the conditions of a dose amount of $1.0\times10^{14}$ per square centimeter and an accelerated voltage of 10 keV, the concentration of B injected into the film was measured by the secondary ion mass spectrometry, and a concentration of $5\times10^{19}$ per cubic centimeter as a concentration at a peak value.

Furthermore, the p type impurity element may be infected to the second microcrystalline silicon film and the region of the substantially intrinsic amorphous silicon film in contact with the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p impurity element must be precisely controlled by using a computer to obtain such density gradient. In the invention, only the accelerated voltage is controlled in the process of the plasma doping method to obtain the density gradient.

Since B element injected as it is does not function as a p type impurity element, a step of activation by a heat treatment is necessary. The heat treatment can be conducted in the air, a nitrogen atmosphere or a hydrogen atmosphere at a temperature of from 200 to 450° C., preferably from 300 to 400° C. In this example, the heat treatment was conducted at 300° C. for 2 hours. (FIG. 1D)

After the above-described step, a second electrode 106 was formed on the second microcrystalline silicon film 105b. The second electrode 106 can be formed by the known method, such as the vacuum vapor deposition method and the sputtering method. Specifically, the second electrode 106 may be $SnO_2$, ZnO or an ITO film. In this example, an ITO film was formed to have a thickness of 70 nm by the sputtering method.

A solar cell according to the invention was obtained through the above-described steps. The process for producing a solar cell in this example comprised a step of forming a first electrode, a step of forming a first microcrystalline silicon film, a step of forming a substantially intrinsic amorphous silicon film, a step of forming a second microcrystalline silicon film, a step of injecting a p type conductive type determining impurity element to the second microcrystalline silicon film, a step of subjecting the first and second microcrystalline silicon films and the substantially intrinsic amorphous silicon film to a heat treatment, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 4

An example of the invention will be described according to the production process of a solar cell shown in FIGS. 3a to 3h. A substrate 301 has a flattened surface and is enough to have a resisting temperature of about 450° C. at most. In this example, a commercially available non-alkali glass was used.

Figure 3A:
FIGS. 3A to 3H are schematic cross sectional views showing an example of a production process of a photoelectric conversion device according to another example.

A first electrode 302 is formed on the surface of the substrate 301. The first electrode 302 was formed by a known method represented by a vacuum vapor deposition method and a sputtering method. It is preferred that the first electrode 302 is formed with a light reflective metallic electrode selected from Ag, Ti, Cr, Ni and Pt, or a two-layered electrode comprising Al laminated with one of the above-described metallic materials. The necessary thickness thereof is about from 100 to 300 nm, but a thickness outside this range can be used irrespective to the constitution of the invention. In this example, Ti was formed in a thickness of 250 nm by a sputtering method. (FIG. 3A)

Figure 3B:
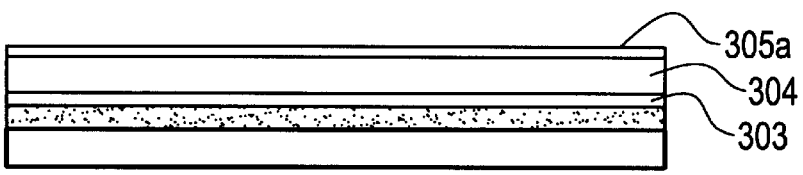

Microcrystalline silicon layers and an amorphous silicon layer to be a photoelectric conversion layer was formed on the surface of the first electrode 302. A first microcrystalline silicon layer 303 was formed by a plasma CVD process without adding a p type or n type conductive type determining impurity element; a substantially intrinsic amorphous silicon layer 304 was formed by a plasma CVD process; and a second microcrystalline silicon layer 305a was formed by a plasma CVD process without adding a p type or n type conductive type determining impurity element. (FIG. 3B)

Figure 6:
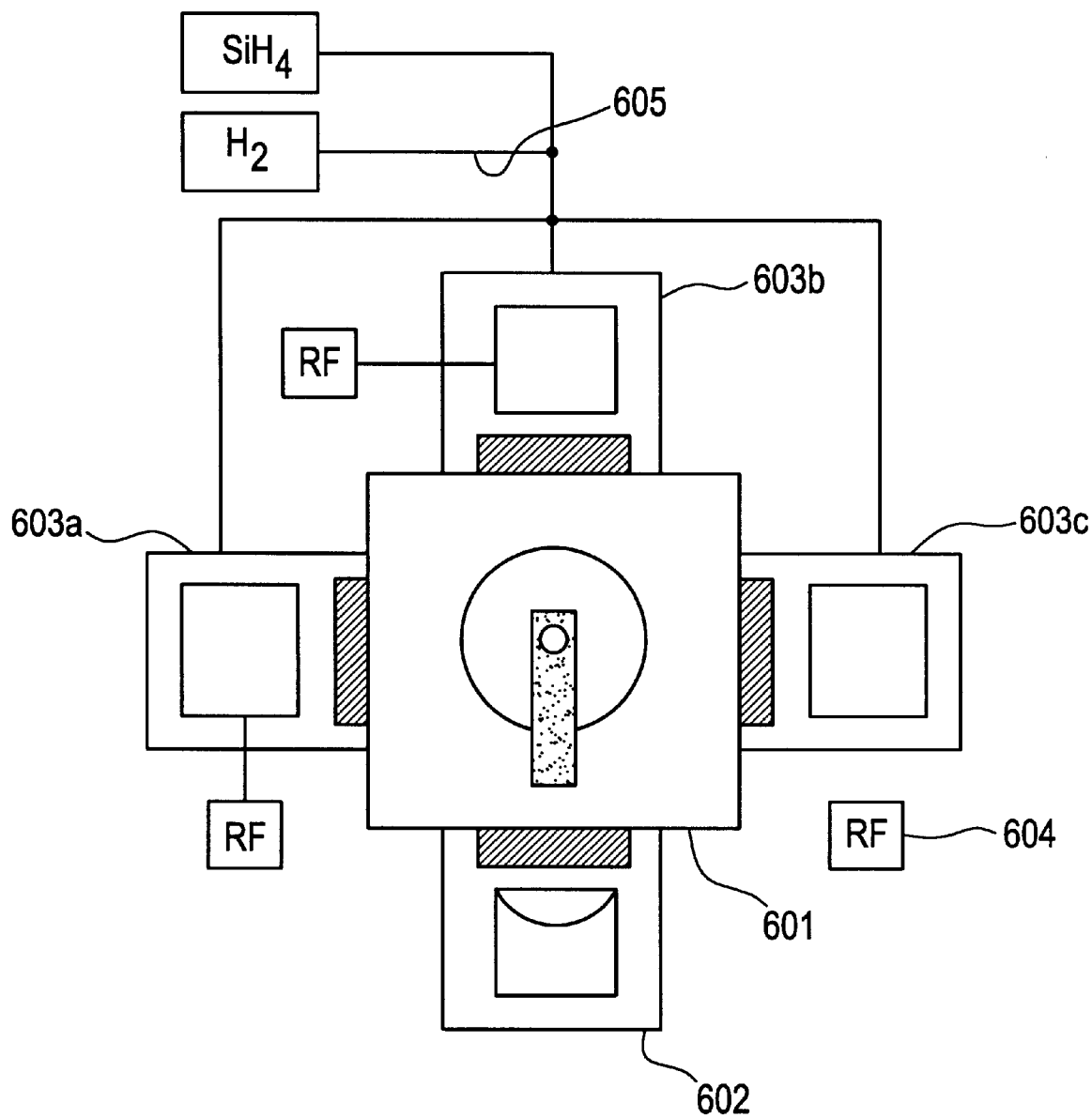
FIG. 6 is a schematic view showing a constitution of a plasma CVD apparatus applied to the production of a photoelectric conversion device of the examples.

FIG. 6 is a conception diagram of a leaf type plasma CVD apparatus used in this example. The plasma CVD apparatus may have a constitution according to the conventional technique and comprises a loading and unloading chamber 602 of a substrate and plural reaction chambers 603a, 603b and 603c around a transfer chamber 601 of a substrate, and a plasma generating means 604 is provided in each of the reaction chambers. While not shown in the figure, in each of the reaction chambers, an evacuation means for maintaining the reaction chamber under reduced pressure, and a means for holding and heating the substrate are provided. In the invention, the first and second microcrystalline silicon films and the substantially intrinsic amorphous silicon film are formed by supplying only $SiH_4$ gas and $H_2$ gas, and thus they can be produced in one reaction chamber using the same discharge means. Therefore, when the leaf type plasma CVD apparatus shown in FIG. 6 was used, the same film formation could be conducted in each of the plural reaction chambers.

While not used in this example, an in-line type plasma CVD apparatus according to the conventional technique comprising a loading and unloading chamber of a substrate and one or plural reaction chambers, which are connected in series, can also be used.

In this step, the first microcrystalline silicon film 303 and the second microcrystalline silicon film 305a formed without adding a p type or n type conductive type determining impurity element were formed under the same conditions. Specifically, the film formation was conducted at an $SiH_4$ flow amount of 2 sccm, an $H_2$ flow amount of 200 sccm, a pressure of 133 Pa, and an RF (13.56 MHz) electric power of 120 mW/cm². At this time, the substrate temperature was maintained at 160° C. The film formation conditions of the microcrystalline silicon layer are basically known techniques and are not limited to the above-described conditions; As examples of the ranges of the film formation conditions, the ratio of $SiH_4/H_2$ may be from 1/30 to 1/100, the pressure may be from 5 to 266 Pa, the RF power density may be from 10 to 250 mW/cm², and the substrate temperature may be from 80 to 300° C. The thickness of the first microcrystalline silicon film 303 may be from 10 to 80 nm, and the thickness of the second microcrystalline silicon film 305a may be from 5 to 50 nm. In this example, the thickness of the first microcrystalline silicon film 303 was 30 nm, and the thickness of the second microcrystalline silicon film 305a was 25 nm.

The substantially intrinsic amorphous silicon film 304 was formed at an $SiH_4$ flow amount of 40 sccm, an $H_2$ flow amount of 360 sccm, a pressure of 133 Pa, and an RF (13.56 MHz) electric power of 48 mW/cm². The substrate temperature at this time was maintained at 160° C. The film formation conditions of the amorphous silicon layer are basically known techniques and are not limited to the above-described conditions. As examples of the ranges of the film formation conditions, the ratio of $H_2$ gas with respect to $SiH_4$ gas may be from 0 to 95%, the pressure may be from 5 to 266 Pa, the RF power density duly be from 5 to 100 mW/cm², and the substrate temperature may be from 80 to 350° C. The thickness is preferably from 100 to 2,000 nm. In this example, the thickness was 1,000 nm.

Instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

After the above-described steps, an integration process was conducted, in which the photoelectric conversion layer and the electrode were divided within the same substrate surface to connect in series. The integration process can be conducted according to the conventional technique and comprises a step of forming an opening in the photoelectric conversion layer and the electrode by the laser scribing method, and a step of forming an insulating resin by the screen printing method. The matters relating to the design of integration process may accord to the known technique and thus are not described in detail here.

Figure 3C:
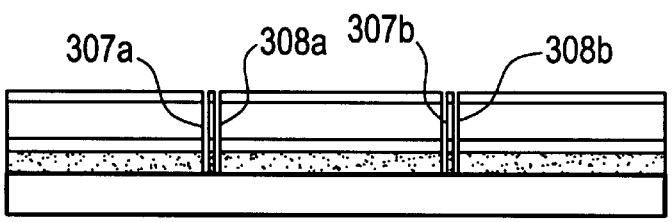

First openings 307a and 307b are openings for separation and insulation formed in the photoelectric conversion layer and the first electrode. These openings are to form plural unit cells within the same substrate surface. Second openings 308a and 308b are formed at the positions adjacent to the first openings 307a and 307b, and they are to connect the first electrode and the second electrode adjacent to each other. The formation of these openings was conducted by the laser scribing method. (FIG. 3C)

Figure 3D:
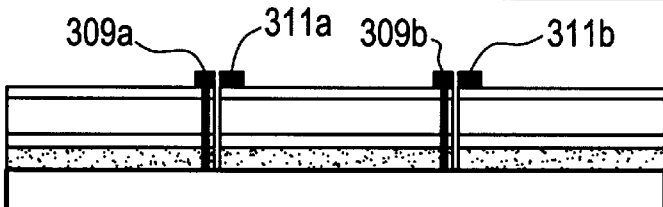

After the formation of the first openings and the second openings, an insulating resin was printed by the screen printing method. First insulating resin regions 309a and 309b, and second insulating resin regions 311a and 311b were formed with the insulating resin. The first insulating resin regions 309a and 309b were formed on the first openings 307a and 307b to fill in them, and the second insulating resin regions 311a and 311b were formed at the positions adjacent to the second openings 308a and 308b. The insulating resin may be a conventional one, which is an acryl series resin or a urethane series resin, and is preferably those capable of being baked at a temperature of about 200° C. The thickness of the insulating resin is not particularly limited. In this example, the thickness of the insulating resin was 20 μm. (FIG. 3D)

Figure 3E:
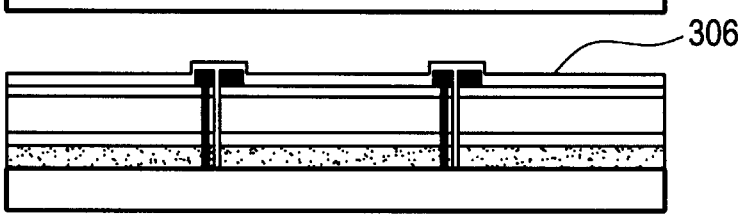

A second electrode 306 was formed to cover the second microcrystalline silicon film 305a, the first insulating resin regions 309a and 309b, and the second insulating resin regions 311a and 311b. The second electrode 306 is a transparent electrode, and can be formed by a known method represented by the vacuum vapor deposition method and the sputtering method. Specifically, $In_2O_3$, $SnO_2$, ZnO and an ITO film may be used. In this example, an ITO film was formed by the sputtering method to have a thickness of 70 nm. (FIG. 3E)

Figure 3F:
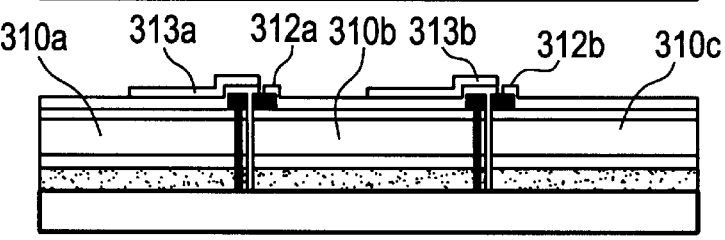

Third openings 312a and 312b to separate the second electrode 306 to the respective unit cells were formed by the laser scribing method in the second insulating resin regions at the positions adjacent to second openings. (FIG. 3F)

Since the second electrode 306 has a relatively high resistance, the provision of an auxiliary electrode 313 results in a more preferred embodiment. The auxiliary electrodes 313a and 313b are formed in intimate contact with the second electrode 306 to cover the second openings 308a and 308b. The auxiliary electrodes are formed with a metallic material having high conductivity. In this example, silver (Ag) as formed into a comb form by the screen printing method. (FIG. 3F)

Figure 3G:
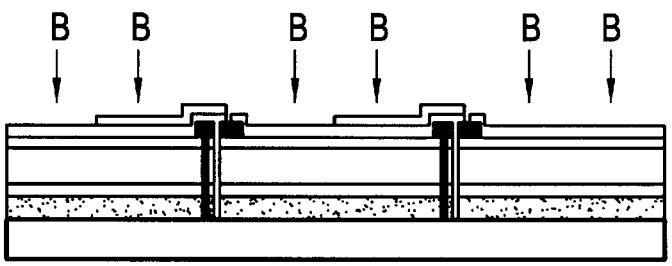

After the above-described steps, a step of injecting a p type conductive type determining impurity element from the surface of the second electrode to the second microcrystalline silicon film 305a by the ion doping method to form a p type microcrystalline silicon film 305b was conducted. As an impurity capable of controlling the valence electron to E) type, an element of the group IIIb in the periodic table, such as boron (B), aluminum (Al), gallium (Ga) and indium (In), may be added. In the ion doping method, a gas of a hydrogenated compound, a chloride or a fluoride of the impurity elements is formed into plasma, and the thus-generated impurity element is ionized to be injected to the substrate by applying an electric field in the direction, by which the ion is accelerated towered the substrate. In this example, $B_2H_6$ gas was used. The dose amount may be from $2.0\times10^{13}$ to $5.0\times10^{15}$ per square centimeter. In this example the dose amount was $1.0\times10^{14}$ per square centimeter. (FIG. 3G)

In the ion doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 keV In this example, the accelerated voltage was 15 keV. When B was injected under the conditions of a dose amount of $1.0\times10^{14}$ per square centimeter and an accelerated voltage of 10 keV, the concentration of B injected into the film was measured by the secondary ion mass spectrometry, and a concentration of $5\times10^{19}$ per cubic centimeter as a concentration a, a peak value.

Furthermore, the p type impurity element may be injected to the second microcrystalline silicon film and the region of the substantially intrinsic amorphous silicon film in contact with the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p impurity element must be precisely controlled by using a computer to obtain such density gradient. In the invention, only the accelerated voltage is controlled in the process of the plasma doping method to obtain the density gradient.

Figure 3H:
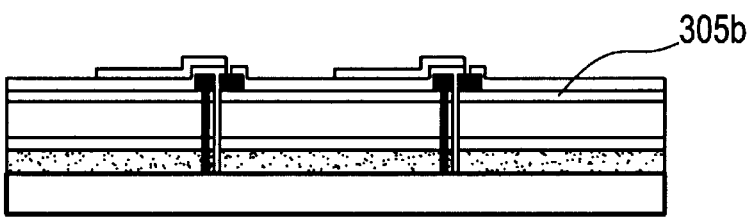

Since B element injected as it is does not function as a p type impurity element, a step of activation by a heat treatment is necessary. The heat treatment can be conducted in the air, a nitrogen atmosphere or a hydrogen atmosphere at a temperature of from 200 to 450° C., preferably from 300 to 400° C. In this example, the heat treatment was conducted at 300° C. for 2 hours. (FIG. 3H)

The change of the conductivity of the microcrystalline silicon film formed on a glass substrate has beer confirmed by experimentation. The results are shown in FIG. 7. The conductivity of the microcrystalline silicon film formed with $SiH_4$ gas and $H_2$ gas immediately after the film formation was about $5\times10^{-4}$ S/cm, and it was increased to from $2\times10^{-0}$ to $3\times10^{-0}$ S/cm by a heat treatment at 300° C. Furthermore, it was confirmed that the conductivity of the film, to which no impurity element was injected by the ion doping method, was increased to about $1.1\times10^{-2}$ S/cm. Furthermore, it was confirmed that the microcrystalline silicon film, to which no impurity element was added, had the n type conductivity.

According to the above-described steps, the photoelectric conversion layer composed of the first n type microcrystalline silicon film, the substantially intrinsic amorphous silicon film, and the second p type microcrystalline silicon film were formed.

According to the above-described steps, a solar cell in which plural unit cells 310a, 310b and 310c were connected in series was obtained. The process for producing a solar cell shown in this example comprises a step of forming a firs electrode, a step of forming a first microcrystalline silicon film, a step of forming a substantially intrinsic amorphous silicon film, a step of forming a second microcrystalline silicon film, a step of injecting a p type conductive type determining impurity element into the second microcrystalline silicon film, a step of heating the first and second microcrystalline silicon films and the substantially intrinsic amorphous silicon film, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 5

An example of the invention will be described according to the production process of a solar cell shown in FIGS. 3A to 3H. A substrate 301 has a flattened surface and is enough to have a resisting temperature of about 450° C. at most. In this example, a commercially available non-alkali glass was used.

A first electrode 302 is formed on the surface of the substrate 301. The first electrode 302 was formed by a known method represented by a vacuum vapor deposition method and a sputtering method. It is preferred that the first electrode 302 is formed with a light reflective metallic electrode selected from Ag, Ti, Cr, Ni and Pt. The necessary thickness thereof is about from 100 to 300 nm, but a thickness outside this range can be used irrespective to the constitution of the invention. In this example, Ti was formed in a thickness of 300 nm by a sputtering method. (FIG. 3A)

Microcrystalline silicon layers and an amorphous silicon layer to be a photoelectric conversion layer was formed on the surface of the first electrode 302. A first microcrystalline silicon layer 303 was formed by a plasma CVD process without adding a p type or n type conductive type determining impurity element; a substantially intrinsic amorphous silicon layer 304 was formed by a plasma CVD process; and a second microcrystalline silicon layer 305a was formed by a plasma CVD process without adding a p type or n type conductive type determining impurity element. (FIG. 3B)

FIG. 6 is a conception diagram of a leaf type plasma CVD apparatus used in this example. The plasma CVD apparatus may have a constitution according to the conventional technique and comprises a loading and unloading chamber 602 of a substrate and plural reaction chambers 603a, 603b and 603c around a transfer chamber 601 of a substrate, and a plasma generating means 604 is provided in each of the reaction chambers. While not shown in the figure, in each of the reaction chambers, an evacuation means for maintaining the reaction chamber under reduced pressure, and a means for holding and heating the substrate are provided. In the invention, the first and second microcrystalline silicon films and the substantially intrinsic amorphous silicon film are formed by supplying only $SiH_4$ gas and $H_2$ gas, and thus they can be produced in one reaction chamber using the same discharge means. Therefore, when the leaf type plasma CVD apparatus shown in FIG. 6 was used, the same film formation could be conducted in each of the plural reaction chambers.

While not used in this example, an in-line type plasma CVD apparatus according to the conventional technique comprising a loading and unloading chamber of a substrate and one or plural reaction chambers, which are connected in series, can also be used.

According to the invention, because the first microcrystalline silicon film 303, the substantially intrinsic amorphous silicon film 304, and the second microcrystalline silicon film 305a can be produced with the same $SiH_4$ gas and $H_2$ gas in the same reaction chamber, they can be continuously produced only by changing the conditions on the film formation. Specifically, the mixing ratio of the gases, the discharge electric power, and the reaction gas pressure are adjusted.

In this step, the first microcrystalline silicon film 303 and the second microcrystalline silicon film 305a formed without adding a p type or n type conductive type determining impurity element were formed under the same conditions. Specifically, the film formation was conducted at an $SiH_4$ flow amount of 4 sccm, an $H_2$ flow amount of 400 sccm, a pressure of 133 Pa, and an RF (13.56 MHz) electric power of 120 mW/cm$^2$. At this time, the substrate temperature was maintained to 160° C. The film formation conditions of the microcrystalline silicon layer are basically known techniques and are not limited to the above-described conditions. As examples of the ranges of the film formation conditions, the ratio of $SiH_4/H_2$ may be from 1/30 to 1/100, the pressure may be from 5 to 266 Pa, the RF power density may be from 10 to 250 mW/cm$^2$, and the substrate temperature may be from 80 to 300° C.

The thickness of the first microcrystalline silicon film 303 is determined by the accumulation time based on the accumulation rate previously obtained. In this example, the thickness of the first microcrystalline silicon film was 30 nm. The formation of the substantially intrinsic amorphous silicon film 304 was conducted without terminating the supply of the reaction gas of $SiH_4$ gas and $H_2$ gas and the glow discharge. Specifically, the $SiH_4$ gas flow amount was increased from 4 sccm to 40 sccm, the $H_2$ gas flow amount was reduced from 400 sccm to 360 sccm, and the RF electric power density was changed from 120 mW/cm$^2$ to 48 mW/cm$^2$. The changing amounts of the gas flow amounts and the RF electric power density depending on time are matters of design, and thus they are not described here. The substrate temperature at this time was maintained to 160° C., and the pressure was maintained to 133 Pa.

The conditions for the film formation of the amorphous silicon film are basically the conventional technique, and they are not limited to the above-described conditions. Examples of the applicable conditions include that the ratio of $H_2$ gas with respect to $SiH_4$ gas may be from 0 to 95%, the pressure may be from 5 to 266 Pa, the RF electric power density may be from 5 to 100 mW/cm$^2$, and the substrate temperature may be from 80 to 350° C.

The thickness of the substantially intrinsic amorphous silicon film 304 is determined by the accumulation time based on the accumulation rate. The thickness of the substantially intrinsic amorphous silicon film 304 in this example was 1,000 nm. The formation of the second microcrystalline silicon film 305a was conducted without terminating the supply of the reaction gas of $H_2$ gas and $SiH_4$ gas and the glow discharge. Specifically, the $SiH_4$ gas flow amount was reduced from 40 sccm to 4 sccm, the $H_2$ gas flow amount was increased from 360 sccm to 400 sccm, and the RF electric power density was changed from 4 mW/cm$^2$ to 120 mW/cm$^2$. The substrate temperature was maintained to 160° C., and the pressure was maintained to 133 Pa. The thickness of the second microcrystalline silicon film 305a was set to 25 nm.

In the above-described steps, instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

By employing the procedures described in this example, a junction structure was obtained, in which the structure was continuously changed from the microcrystalline silicon film to the amorphous silicon film, and from the amorphous silicon film to the microcrystalline silicon film.

After the above-described steps, an integration process was conducted, in which the photoelectric conversion layer and the electrode were divided within the same substrate surface to connect in series. The integration process can be conducted according to the conventional technique and comprises a step of forming an opening in the photoelectric conversion layer and the electrode by the laser scribing method, and a step of forming an insulating resin by the screen printing method. The matters relating to the design of integration process may accord to the known technique and thus are not described in detail here.

First openings 307a and 307b are openings for separation and insulation formed in the photoelectric conversion layer and the first electrode. These openings are to form plural unit cells within the same substrate surface. Second openings 308a and 308b are formed at the positions adjacent to the first openings 307a and 307b, and they are to connect the first electrode and the second electrode adjacent to each other. The formation of these openings was conducted by the laser scribing method. (FIG. 3C)

After the formation of the first openings and the second openings, an insulating resin was printed by the screen printing method. First insulating resin regions 309a and 309b, and second insulating resin regions 311a and 311b were formed with the insulating resin. The first insulating resin regions 309a and 309b were formed on the first openings 307a and 307b to fill in them, and the second insulating resin regions 311a and 311b were formed at the positions adjacent to the second openings 308a and 308b. The insulating resin may be a conventional one, which is an acryl series resin or a urethane series resin, and is preferably those capable of being baked at a temperature of about 200° C. The thickness of the insulating resin is not particularly limited. In this example, the thickness of the insulating resin was 20 μm. (FIG. 3D)

A second electrode 306 was formed to cover the second microcrystalline silicon film 305a, the first insulating resin regions 309a and 309b, and the second insulating resin regions 311a and 311b. The second electrode 306 is a transparent electrode, and can be formed by a known method represented by the vacuum vapor deposition method and the sputtering method. Specifically, $In_2O_3$, $SnO_2$, ZnO and an ITO film may be used. In this example, an ITO film was formed by the sputtering method to have a thickness of 70 nm. (FIG. 3E)

Third openings 312a and 312b to separate the second electrode 306 to the respective unit cells were formed in the second insulating resin regions at the positions adjacent to second openings. (FIG. 3F)

Since the second electrode 306 has a relatively high resistance, the provision of an auxiliary electrode 313 results in a more preferred embodiment. The auxiliary electrodes 313a and 313b are formed in intimate contact with the second electrode 306 to cover the second openings 308a and 308b. The auxiliary electrodes are formed with a metallic material having high conductivity. In this example, silver (Ag) was formed into a comb form by the screen printing method. (FIG. 3F)

After the above-described steps, a step of injecting a p type conductive type determining impurity element from the surface of the second electrode to the second microcrystalline silicon film 305a by the ion doping method to form a p type microcrystalline silicon film 305b was conducted. As an impurity capable of controlling the valence electron to p type, an element of the group IIIb in the periodic table, such as boron (B), aluminum (Al), gallium (Ga) and indium (In), may be added. In the ion doping method, a gas of a hydrogenated compound, a chloride or a fluoride of the impurity elements is formed into plasma, and the thus-generated impurity element is ionized to be injected to the substrate by applying an electric field in the direction, by which the ion is accelerated towered the substrate. In this example, $B_2H_6$ gas was used. The dose amount may be from $2.0 \times 10^{13}$ to $5.0 \times 10^{15}$ per square centimeter. In this example the dose amount was $1.0 \times 10^{14}$ per square centimeter. (FIG. 3G)

In the ion doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 ReV. In this example, the accelerated voltage was 10 keV. When B was injected under the conditions of a close amount of $1.0 \times 10^{14}$ per square centimeter and an accelerated voltage of 10 kev, the concentration of B injected into the film was measured by the secondary ion mass analysis, and a concentration of $5 \times 10^{19}$ per cubic centimeter as a concentration at a peak value.

As a result of experimentation, the amount of B injected into the film changed in substantially proportion to the dose amount, and when the dose amount was $1.0 \times 10^{15}$ per square centimeter, the concentration of $5 \times 10^{20}$ per cubic centimeter.

Furthermore, the p type impurity element may be injected to the second micrcocrystalline silicon film and the region of the vicinity of the boundary between the substantially intrinsic amorphous silicon film and the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p impurity element must be precisely controlled by using a computer to obtain such density gradient. In the invention, only the accelerated voltage is controlled in the process of the plasma doping method to obtain the density gradient.

Since B element injected as it is does not function as a p type impurity element, a step of activation by a heat treatment is necessary. The heat treatment can be conducted in the air, a nitrogen atmosphere or a hydrogen atmosphere at a temperature of from 200 to 450° C., preferably from 300 to 400° C. In this example, the heat treatment was conducted at 300° C. for 2 hours. (FIG. 3H)

The conductivity of the microcrystalline silicon film after the film formation was about $5 \times 10^{-4}$ S/cm, which was confirmed to be increased to from $2 \times 10^{-0}$ S/cm to $3 \times 10^{-0}$ S/cm by the heat treatment at 300° C. Furthermore, the conductivity of the microcrystalline silicon film, to which no impurity element was added, was confirmed to be increased. It was also confirmed that the microcrystalline silicon film, to which no impurity element was added, had n type conductivity.

According to the above-described steps, a solar cell in which plural unit cells 310a, 310b and 310c were connected in series was obtained. The process for producing a solar cell shown in this example comprises a step of forming a first electrode, a step of forming a first microcrystalline silicon film, a step of forming a substantially intrinsic amorphous silicon film, a step of forming a second microcrystalline silicon film, a step of injecting a p type conductive type determining impurity element into the second microcrystalline silicon film, and a step of heating the first and second microcrystalline silicon films and the substantially intrinsic amorphous silicon film. By adding a step of patterning the first or second electrode by a known method to arrange it at the prescribed position on the surface of the substrate, this process can be applied to the production of a serial connection structure of a solar cell, an image sensor and a photo sensor.

EXAMPLE 6

An example of the invention will be described according to the production process of a solar cell shown in FIGS. 4A to 4H. A substrate 401 has a flattened surface and is enough to have a resisting temperature of about 450° C. at most. In this example, a commercially available non-alkali glass was used.

Figure 4A:
FIGS. 4A to 4H are schematic cross sectional views showing an example of a production process of a photoelectric conversion device according to another example.

A first electrode is formed on the surface of the substrate 401. The first electrode 402 was formed by a known method represented by a vacuum vapor deposition method and a sputtering method. It is preferred that the first electrode 402 is formed with a light reflective metallic electrode selected from Ag, Ti, Cr, Ni and Pt. The necessary thickness thereof is about from 100 to 300 nm, but a thickness outside this range can be used irrespective to the constitution of the invention. In this example, Ti was formed in a thickness of 300 nm by a sputtering method. (FIG. 4A)

Figure 4B:
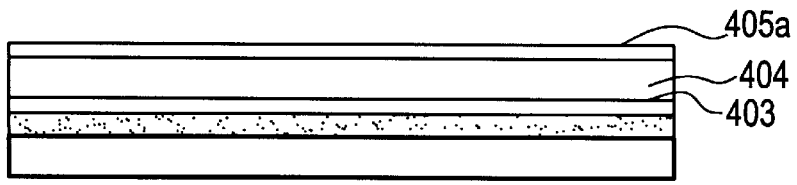

Microcrystalline silicon layers and an amorphous silicon layer to be a photoelectric conversion layer was formed on the surface of the first electrode 402. A first microcrystalline silicon layer 403 was formed by a plasma CVD process without adding a p type or n type conductive type determining impurity element; a substantially intrinsic amorphous silicon layer 404 was formed by a plasma CVD process; and a second microcrystalline silicon layer 405a was formed by a plasma CVD process without adding a p type or n type conductive type determining impurity element. (FIG. 4B)

FIG. 6 is a conception diagram of a leaf type plasma CVD apparatus used in this example. The plasma CVD apparatus may have a constitution according to the conventional technique and comprises a loading and unloading chamber 602 of a substrate and plural reaction chambers 603a, 603b and 603c around a transfer chamber 601 of a substrate, and a plasma generating means 604 is provided in each of the reaction chambers. While not shown in the figure, in each of the reaction chambers, an evacuation means for maintaining the reaction chamber under reduced pressure, and a means for holding and heating the substrate are provided. In the invention, the first and second microcrystalline silicon films and the substantially intrinsic amorphous silicon film are formed by supplying only $SiH_4$ gas and $H_2$ gas, and thus they can be produced in one reaction chamber using the same discharge means. Therefore, when the leaf type plasma CVD apparatus shown in FIG. 6 was used, the same film formation could be conducted in each of the plural reaction chambers.

While not used in this example, an in-line type plasma CVD apparatus according to the conventional technique comprising a loading and unloading chamber of a substrate and one or plural reaction chambers, which are connected in series, can also be used.

In this step, the first microcrystalline silicon film 403 and the second microcrystalline silicon film 405a formed without adding a p type or n type conductive type determining impurity element were formed under the same conditions. Specifically, the film formation was conducted at an $SiH_4$ flow amount of 2 sccm, an $H_2$ flow amount of 200 sccm, a pressure of 133 Pa, and an RF (13.56 MHz) electric power of 120 mW/cm². The film formation conditions of the microcrystalline silicon layer are basically known techniques and are not limited to the above-described conditions. As examples of the ranges of the film formation conditions, the ratio of $SiH_4/H_2$ may be from 1/30 to 1/100, the pressure may be from 5 to 266 Pa, the RF power density may be from 10 to 250 mW/cm², and the substrate temperature may be from 80 to 300° C. The accumulated thickness of the first microcrystalline silicon film 403 may be from 10 to 80 nm, and the accumulated thickness of the second microcrystalline silicon film 405a may be from 5 to 50 nm.

In this example, the accumulated thickness of first microcrystalline silicon film 403 was 30 nm, and the accumulated thickness of the second microcrystalline silicon film 405a was 25 nm.

The substantially intrinsic amorphous silicon film 404 was formed at an $SiH_4$ flow amount of 40 sccm, an $H_2$ flow amount of 360 sccm, a pressure of 133 Pa, and an RF (13.56 MHz) electric power of 48 mW/cm². The substrate temperature at this time was maintained to 160° C. The film formation conditions of the amorphous silicon layer are basically known techniques and are not limited to the above-described conditions. As examples of the ranges of the film formation conditions, the ratio of $H_2$ gas with respect to $SiH_4$ gas may be from 0 to 95%, the pressure may be from 5 to 266 Pa, the RF power density may be from 5 to 100 mw/cm², and the substrate temperature may be from 80 to 350° C. The thickness is preferably from 100 to 2,000 nm. In this example, the thickness was 1,000 nm.

Figure 4C:
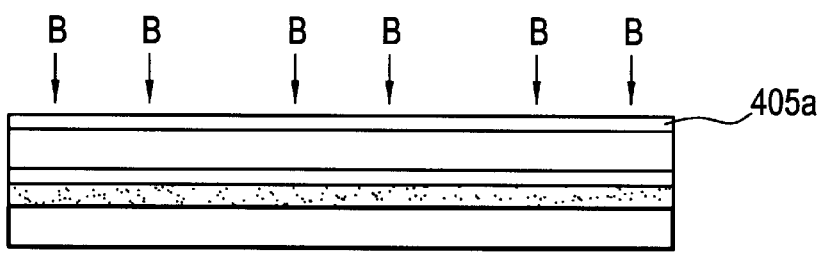

Instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn). A step of injecting a p type conductive type determining impurity element from the surface of the second electrode to the second microcrystalline silicon film 405a to form a p type microcrystalline silicon film 405b was conducted by the ion doping method and a subsequent heat treatment. As an impurity capable of controlling the valence electron to p type, an element of the group IIIb in the periodic table, such as boron (B), aluminum (Al), gallium (Ga) and indium (In), may be added. In the ion doping method, a gas of a hydrogenated compound, a chloride or a fluoride of the impurity elements is formed into plasma, and the thus-generated impurity element is ionized to be injected to the substrate by applying an electric field in the direction, by which the ion is accelerated toward the substrate. In this example, $B_2H_6$ gas was used. The dose amount may be from $2.0\times10^{13}$ to $5.0\times10^{15}$ per square centimeter. In this example the dose amount was $1.0\times10^{14}$ per square centimeter. (FIG. 4C)

In the ion doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 keV. In this example, the accelerated voltage was 10 keV. When B was injected under the conditions of a dose amount of $1.0\times10^{14}$ per square centimeter and an accelerated voltage of 10 kev, the concentration of B injected into the film was measured by the secondary ion mass spectrometry, and a concentration of $5\times10^{19}$ per cubic centimeter as a concentration at a peak value.

As a result of experimentation, the amount of B injected into the film changed in substantially proportion to the dose amount, and when the dose amount was $1.0\times10^{15}$ per square centimeter, the concentration of $5\times10^{20}$ per cubic centimeter.

Furthermore, the p type impurity element may be injected to the second microcrystalline silicon film and the region of the vicinity of the boundary between the substantially intrinsic amorphous silicon film and the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p type impurity element must be precisely controlled by using a computer to obtain such density gradient. In the invention, only the accelerated voltage is controlled in the process of the plasma doping method to obtain the density gradient.

Figure 4D:
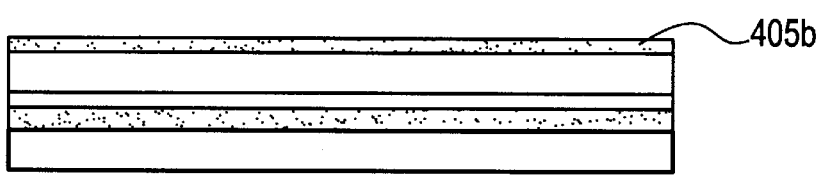

Since B element injected as it is does not function as a p type impurity element, a step of activation by a heat treatment is necessary. The heat treatment can be conducted in the air, a nitrogen atmosphere or a hydrogen atmosphere at a temperature of from 200 to 450° C., preferably from 300 to 400° C. In this example, the heat treatment was conducted at 300° C. for 2 hours. (FIG. 4D)

The conductivity of the microcrystalline silicon film after the film formation was about $5 \times 10^{-4}$ S/cm, which was confirmed to be increased to from $2 \times 10^{-0}$ S/cm to $3 \times 10^{-0}$ S/cm by the heat treatment at 300° C. Furthermore, the conductivity of the microcrystalline silicon film, to which no impurity element was added, was confirmed to be increased to about $1.1 \times 10^{-2}$ S/cm. It was also confirmed that the microcrystalline silicon film, to which no impurity element was added, had n type conductivity.

The change of the conductivity of the microcrystalline silicon film formed on a glass substrate has been confirmed by experimentation. The results are shown in FIG. 7. The conductivity of the microcrystalline silicon film formed with $SiH_4$ gas and $H_2$ gas immediately after the film formation was about $5 \times 10^{-4}$ S/cm, and it was increased by injecting a p type impurity followed by heating according to the invention. It was confirmed that the conductivity was increased to from $2 \times 10^{-0}$ to $3 \times 10^{-0}$ S/cm by a heat treatment at 300° C. Furthermore, it was confirmed that the conductivity of the film, to which no impurity element was injected by the ion doping method, was increased to about $1.1 \times 10^{-2}$ S/cm. Furthermore, it was confirmed that the microcrystalline silicon film, to which no impurity element was added, had the n type conductivity.

According to the above-described steps, the photoelectric conversion layer composed of the first n type microcrystalline silicon film, the substantially intrinsic amorphous silicon film, and the second p type microcrystalline silicon film were formed.

After the above-described steps, an integration process was conducted, in which the photoelectric conversion layer and the electrode were divided within the same substrate surface to connect in series. The integration process can be conducted according to the conventional technique and comprises a step of forming an opening in the photoelectric conversion layer and the electrode by the laser scribing method, and a step of forming an insulating resin by the screen printing method. The matters relating to the design of integration process may accord to the known technique and thus are not described in detail here.

Figure 4E:
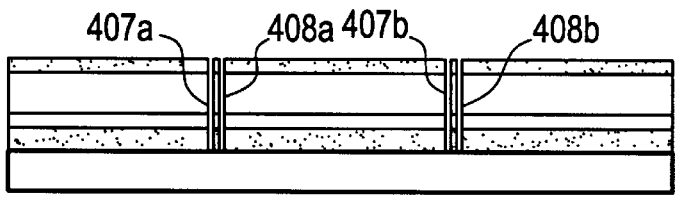

First openings 407a and 407b are openings for separation and insulation formed in the photoelectric conversion layer and the first electrode. These openings are to form plural unit cells within the same substrate surface. Second openings 408a and 408b are formed at the positions adjacent to the first openings 407a and 407b, and they are to connect the first electrode and the second electrode adjacent to each other. The formation of these openings was conducted by the laser scribing method. (FIG. 4E)

Figure 4F:
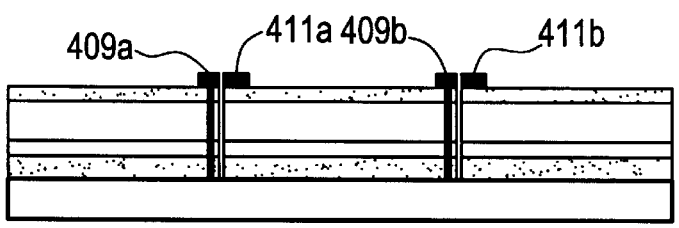

After the formation of the first openings and the second openings, an insulating resin was printed by the screen printing method. First insulating resin regions 409a and 409b, and second insulating resin regions 411a and 411b were formed with the insulating resin. The first insulating resin regions 409a and 409b were formed on the first openings 407a and 407b to fill in them, and the second insulating resin regions 411a and 411b were formed at the positions adjacent to the second openings 408a and 408b. The insulating resin may be a conventional one, which is an acryl series resin or an urethane series resin, and is preferably those capable of being baked at a temperature of about 200° C. The thickness of the insulating resin is not particularly limited. In this example, the thickness of the insulating resin was 20 μm. (FIG. 4F)

Figure 4G:
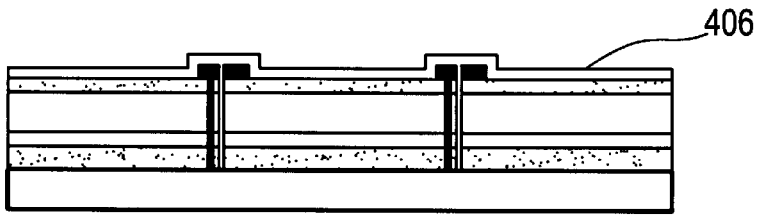

A second electrode 406 was formed to cover the second microcrystalline silicon film 405b, the first insulating resin regions 409a and 409b, and the second insulating resin regions 411a and 411b. The second electrode 406 is a transparent electrode, and can be formed by a known method represented by the vacuum vapor deposition method and the sputtering method. Specifically, $In_2O_3$, $SnO_2$, ZnO and an ITO film may be used. In this example, an ITO film was formed by the sputtering method to have a thickness of 70 nm. (FIG. 4G)

Third openings 412a and 412b to separate the second electrode 406 to the respective unit cells were formed by the laser scribing method in the second insulating resin regions at the positions adjacent to second openings.

Figure 4H:
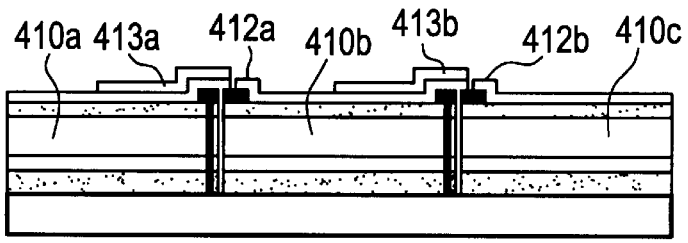

Since the second electrode 406 has a relatively high resistance, the provision of an auxiliary electrode 413 results in a more preferred embodiment. The auxiliary electrodes 413a and 413b are formed in intimate contact with the second electrode 406 to cover the second openings 408a and 408b. The auxiliary electrodes are formed with a metallic material having high conductivity. In this example, silver (Ag) was formed into a comb form by the screen printing method. (FIG. 4H)

According to the above-described steps, a solar cell in which plural unit cells 410a, 410b and 410c were connected in series was obtained. The process for producing a solar cell shown in this example comprises a step of forming a first electrode, a step of forming a first microcrystalline silicon film, a step of forming a substantially intrinsic amorphous silicon film, a step of forming a second microcrystalline silicon film, a step of injecting a p type conductive type determining impurity element into the second microcrystalline silicon film, a step of heating the first and second microcrystalline silicon films and the substantially intrinsic amorphous silicon film, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 7

An example of the invention will be described according to the production process of a solar cell shown in FIGS. 4A to 4H. A substrate 401 has a flattened surface and is enough to have a resisting temperature of about 450° C. at most. In this example, a commercially available non-alkali glass was used.

A first electrode is formed on the surface of the substrate 401. The first electrode 402 was formed by a known method represented by a vacuum vapor deposition method and a sputtering method. It is preferred that the first electrode 402 is formed with a light reflective metallic electrode selected from Ag, Ti, Cr, Ni and Pt. The necessary thickness thereof is about from 100 to 300 nm, but a thickness outside this range can be used irrespective to the constitution of the invention. In this example, Ti was formed in a thickness of 300 nm by a sputtering method. (FIG. 4A)

Microcrystalline silicon layers and an amorphous silicon layer to be a photoelectric conversion layer was formed on the surface of the first electrode 402. A first microcrystalline silicon layer 403 was formed by a plasma CVD process without adding a p type or n type conductive type determining impurity element; a substantially intrinsic amorphous silicon layer 404 was formed by a plasma CVD process; and a second microcrystalline silicon layer 405a was formed by a plasma CVD process without adding a p type or n type conductive type determining impurity element. (FIG. 4B)

FIG. 6 is a conception diagram of a leaf type plasma CVD apparatus used in this example. The plasma CVD apparatus may have a constitution according to the conventional technique and comprises a loading and unloading chamber 602 of a substrate and plural reaction chambers 603a, 603b and 603c around a transfer chamber 601 of a substrate, and a plasma generating means 604 is provided in each of the reaction chambers. While not shown in the figure, in each of the reaction chambers, an evacuation means for maintaining the reaction chamber under reduced pressure, and a means for holding and heating the substrate are provided. In the invention, the first and second microcrystalline silicon films and the substantially intrinsic amorphous silicon film are formed by supplying only $SiH_4$ gas and $H_2$ gas, and thus they can be produced in one reaction chamber using the same discharge means. Therefore, when the leaf type plasma CVD apparatus shown in FIG. 6 was used, the same film formation could be conducted in each of the plural reaction chambers.

While not used in this example, an in-line type plasma CVD apparatus according to the conventional technique comprising a loading and unloading chamber of a substrate and one or plural reaction chambers, which are connected in series, can also be used.

According to the invention, because the first microcrystalline silicon film 403, the substantially intrinsic amorphous silicon film 404, and the second microcrystalline silicon film 405a can be produced with the same $SiH_4$ gas and $H_2$ gas in the same reaction chamber, they can be continuously produced only by changing the conditions on the film formation. Specifically, the mixing ratio of the gases, the discharge electric power, and the reaction gas pressure are adjusted.

In this step, the first microcrystalline silicon film 403 and the second microcrystalline silicon film 405a formed without adding a p type or n type conductive type determining impurity element were formed under the same conditions. Specifically, the film formation was conducted at an $SiH_4$ flow amount of 4 sccm, an $H_2$ flow amount of 400 sccm, a pressure of 133 Pa, and an RF (13.56 MHz) electric power of 120 mW/cm$^2$. The film formation conditions of the microcrystalline silicon layer are basically known techniques and are not limited to the above-described conditions. As examples of the ranges of the film formation conditions, the ratio of $SiH_4/H_2$ may be from 1/30 to 1/100, the pressure may be from 5 to 266 Pa, the RF power density may be from 10 to 250 mW/cm$^2$, and the substrate temperature may be from 80 to 300° C.

The thickness of the first microcrystalline silicon film 403 is determined by the accumulation time based on the accumulation rate previously obtained. In this example, the thickness of the first microcrystalline silicon film was 30 nm. The formation of the substantially intrinsic amorphous silicon film 404 was conducted without terminating the supply of the reaction gas of $SiH_4$ gas and $H_2$ gas and the glow discharge. Specifically, the $SiH_4$ gas flow amount was increased from 4 sccm to 40 sccm, the $H_2$ gas flow amount was reduced from 400 sccm to 360 sccm, and the RF electric power density was changed from 120 mW/cm$^2$ to 48 mW/cm$^2$. The changing amounts of the gas flow amounts and the RF electric power density depending on time are matters of design, and thus they are not described here. The substrate temperature at this time was maintained to 160° C., and the pressure was maintained to 133 Pa.

The conditions for the film formation of the amorphous silicon film are basically the conventional technique, and they are not limited to the above-described conditions. Examples of the applicable conditions include that the ratio of $H_2$ gas with respect to $SiH_4$ gas may be from 0 to 95%, the pressure may be from 5 to 266 Pa, the RF electric power density may be from 5 to 100 mW/cm$^2$, and the substrate temperature may be from 80 to 350° C.

The thickness of the substantially intrinsic amorphous silicon film 404 is determined by the accumulation time based on the accumulation rate. The thickness of the substantially intrinsic amorphous silicon film 404 in this example was 1,000 nm. The formation of the second microcrystalline silicon film 405a was conducted without terminating the supply of the reaction gas of $H_2$ gas and $SiH_4$ gas and the glow discharge. Specifically, the $SiH_4$ gas flow amount was reduced from 40 sccm to 4 sccm, the $H_2$ gas flow amount was increased from 360 sccm to 400 sccm, and the RF electric power density was changed from 4 mW/cm$^2$ to 120 mW/cm$^2$. The substrate temperature was maintained to 160° C., and the pressure was maintained to 133 Pa. The thickness of the second microcrystalline silicon film 405a was set to 25 nm.

In the above-described steps, instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

By employing the procedures described in this example, a junction structure was obtained, in which the structure was continuously changed from the microcrystalline silicon film to the amorphous silicon film, and from the amorphous silicon film to the microcrystalline silicon film.

A step of injecting a p type conductive type determining impurity element from the surface of the second electrode to the second microcrystalline silicon film 405a to form a p type microcrystalline silicon film 405b was conducted by the ion doping method and a subsequent heat treatment. As an impurity capable of controlling the valence electron to p type, an element of the group IIIb in the periodic table, such as boron (B), aluminum (Al), gallium (Ga) and indium (In), may be added. In the ion doping method, a gas of a hydrogenated compound, a chloride or a fluoride of the impurity elements is formed into plasma, and the thus-generated impurity element is ionized to be injected to the substrate by applying an electric field in the direction, by which the ion is accelerated towered the substrate. In this example, $B_2H_6$ gas was used. The dose amount may be from $2.0 \times 10^{13}$ to $5.0 \times 10^{15}$ per square centimeter. In this example the dose amount wags $1.0 \times 10^{14}$ per square centimeter. (FIG. 4C)

In the ion doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 keV. In this example, the accelerated voltage was 10 keV. when B was injected under the conditions of a dose amount of $1.0 \times 10^{14}$ per square centimeter and an accelerated voltage of 10 keV, the concentration of B injected into the film was measured by the secondary ion mass analysis, and a concentration of $5 \times 10^{19}$ per cubic centimeter as a concentration at a peak value.

As a result of experimentation, the amount of B injected into the film changed in substantially proportion to the dose amount, and when the dose amount was $1.0 \times 10^{15}$ per square centimeter, the concentration of $5 \times 10^{20}$ per cubic centimeter.

Furthermore, the p type impurity element may be injected to the second microcrystalline silicon film and the region of the vicinity of the boundary between the substantially intrinsic amorphous silicon film and the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p impurity element must be precisely controlled by using a computer to obtain :such density gradient. In the invention, only the accelerated voltage is controlled in the process of the plasma doping method to obtain the density gradient.

Since B element injected as it is does not function as a p type impurity element, a step of activation by a heat treatment is necessary. The heat treatment can be conducted in the air, a nitrogen atmosphere or a hydrogen atmosphere at a temperature of from 200 to 450° C., preferably from 300 to 400° C. In this example, the heat treatment was conducted at 300° C. for 2 hours. (FIG. 4D)

The conductivity of the microcrystalline silicon film after the film formation was about $5 \times 10^{-4}$ S/cm, which was confirmed to be increased to from $2 \times 10^{-0}$ S/cm to $3 \times 10^{-0}$ S/cm by the heat treatment at 300° C. Furthermore, the conductivity of the microcrystalline silicon film, to which no impurity element was added, was confirmed to be increased to about $1.1 \times 10^{-2}$ S/cm.

After the above-described steps, an integration process was conducted, in which the photoelectric conversion layer and the electrode were divided within the same substrate surface to connect in series. The integration process can be conducted according to the conventional technique and comprises a step of forming an opening in the photoelectric conversion layer and the electrode by the laser scribing method, and a step of forming an insulating resin by the screen printing method. The matters relating to the design of integration process may accord to the known technique and thus are not described in detail here.

First openings 407a and 407b are openings for separation and insulation formed in the photoelectric conversion layer and the first electrode. These openings are to form plural unit cells within the same substrate surface. Second openings 408a and 408b are formed at the positions adjacent to the first openings 407a and 407b, and they are to connect the first electrode and the second electrode adjacent to each other. The formation of these openings was conducted by the laser scribing method. (FIG. 4E)

After the formation of the first openings and the second openings, an insulating resin was printed by the screen printing method. First insulating resin regions 409a and 409b, and second insulating resin regions 411a and 411b were formed with the insulating resin. The first insulating resin regions 409a and 409b were formed on the first openings 407a and 407b to fill in them, and the second insulating resin regions 411a and 411b were formed at the positions adjacent to the second openings 408a and 408b. The insulating resin may be a conventional one, which is an acryl series resin or a urethane series resin, and is preferably those capable of being baked at a temperature of about 200° C. The thickness of the insulating resin is not particularly limited. In this example, the thickness of the insulating resin was 20 μm. (FIG. 4F)

A second electrode 406 was formed to cover the second microcrystalline silicon film 405b, the first insulating resin regions 409a and 409b, and the second insulating resin regions 411a and 411b. The second electrode 406 is a transparent electrode, and can be formed by a known method represented by the vacuum vapor deposition method and the sputtering method. Specifically, $In_2O_3$, $SnO_2$, ZnO and an ITO film may be used. In this example, an ITO film was formed by the sputtering method to have a thickness of 70 nm. (FIG. 4G)

Third openings 412a and 412b to separate the second electrode 406 to the respective unit cells were formed by the laser scribing method in the second insulating resin regions at the positions adjacent to second openings.

Since the second electrode 406 has a relatively high resistance, the provision of an auxiliary electrodes 413a and 413b results in a more preferred embodiment. The auxiliary electrodes 413 are formed in intimate contact with the second electrode 406 to cover the second openings 408a and 408b. The auxiliary electrodes are formed with a metallic material having high conductivity. In this example, silver (Ag) was formed into a comb form by the screen printing method. (FIG. 4H)

According to the above-described steps, a solar cell in which plural unit cells 410a, 410b and 410c were connected in series was obtained. The process for producing a solar cell shown in this example comprises a step of forming a first electrode, a step of forming a first microcrystalline silicon film, a step of forming a substantially intrinsic amorphous silicon film, a step of forming a second microcrystalline silicon film, a step of injecting a p type conductive type determining impurity element into the second microcrystalline silicon film, a step of heating the first and second microcrystalline silicon films and the substantially intrinsic amorphous silicon film, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 8

The invention will be described with reference to the production process of a solar cell having a structure in which light is incident from the side of a substrate. A substrate 501 has a flattened surface and is enough to have a resisting temperature of about 450° C. at most. In this example, a commercially available non-alkali glass was used.

Figure 5A:
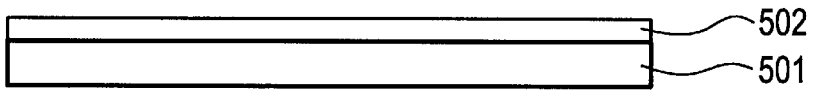
FIGS. 5A to 5I are schematic cross sectional views showing an example of a production process of a photoelectric conversion device according to another example.

A first electrode 502 is formed on the surface of the substrate 501. The first electrode 502 was formed by a known method represented by a vacuum vapor deposition method and a sputtering method. It is preferred that the first electrode 502 is formed with a metal oxide material selected from $SnO_2$, $In_2O_3$ and ZnO. The necessary thickness thereof is about from 60 to 120 nm taking the optical characteristics and the electric characteristics into consideration, but a thickness outside this range can be used irrespective to the constitution of the invention. (FIG. 5A)

Figure 5B:
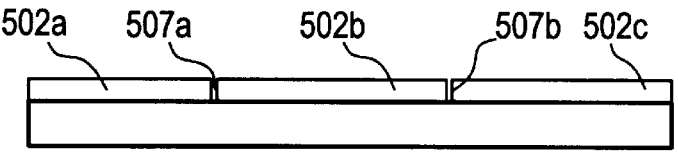

An integration process was conducted according to the known technique to produce a solar cell submodule having an integrated structure, in which plural unit cells were formed within the same substrate surface, and they were connected in series. In this example, the first electrode 502 was separated into plural first electrodes 502a, 502b and 502c having a width of 100 μm by making plural first openings 507a and 507b by the known laser scribing method. (FIG. 5B)

Figure 5C:

A second microcrystalline silicon layer 505a was formed by the plasma CVD) method without adding a p type or n type conductive type determining impurity element, to cover the first electrodes 502a, 502b and 502c and the first openings 507a and 507b. In this step, the second microcrystalline silicon layer 505a formed without adding a p type or n type conductive type determining impurity element was formed at an $SiH_4$ flow amount of 2 sccm, an $H_2$ flow amount of 200 sccm, a pressure of 133 Pa, and an RF (13.56 MHz) electric power of 120 mW/cm$^2$. The substrate temperature at this time was maintained to 160° C. The conditions for the formation of the microcrystalline silicon film are basically the conventional technique, and they are not limited to the above-described conditions. Examples of he applicable conditions include that the ratio $SiH_4/H_2$ may be from 1/30 to 1/100, the pressure may be from 5 to 266 Pa, the RF electric power may be from 10 to 250 mW/cm$^2$, and the substrate temperature may be from 80 to 300° C. The thickness of the second microcrystalline silicon film 505a may be from 10 to 80 nm. (FIG. 5C)

Figure 5D:
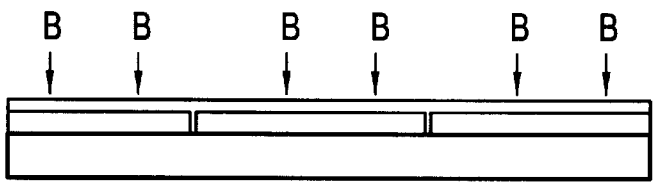

After forming the second microcrystalline silicon film 505a, the sample was once taken out from the reaction chamber of the plasma CVD apparatus, and a step of injecting a p type conductive type determining impurity element was conducted by the ion doping method and a subsequent heat treatment. As an impurity that can control the valence electron of the microcrystalline silicon film to p type, an element of the group IIIb of the periodic table, such as boron (B), aluminium (Al), gallium (Ga) and indium (In), may be added. In the ion doping method, a gas of a hydrogenated compound, a chloride or a fluoride of the impurity elements is formed into plasma, and the thus-generated impurity element is ionized to be injected to the substrate by applying an electric field in the direction, by which the ion is accelerated toward the substrate. In this example, $B_2H_6$ gas was used. The dose amount may be from $2.0 \times 10^{13}$ to $5.0 \times 10^{15}$ per square centimeter. In this example the dose amount was $1.0 \times 10^{14}$ per square centimeter. (FIG. 5D)

A step of forming a substantially intrinsic amorphous silicon film 504 and a first microcrystalline silicon film 503 was conducted. The substantially intrinsic amorphous silicon film 504 was formed by applying an RF (13.56 MHz) electric power of 48 mW/cm$^2$ with maintaining the pressure to 133 Pa at an $SiH_4$ flow amount of 40 sccm and an $H_2$ flow amount of 360 sccm. The substrate temperature at this time was maintained at 160° C. The film formation conditions of the amorphous silicon film are basically the conventional technique, and they are not limited to the above-described conditions. Examples of the applicable conditions include that the ratio of $H_2$ gas with respect to $SiH_4$ gas may be from 0 to 90%, the pressure may be from 5 to 266 Pa, the RF electric power density may be from 5 to 100 mW/cm$^2$, and the substrate temperature may be from 80 to 350° C. The accumulated thickness is preferably from 100 to 2,000 nm. In this example, the thickness of the film was 1,000 nm.

Instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

Figure 5E:
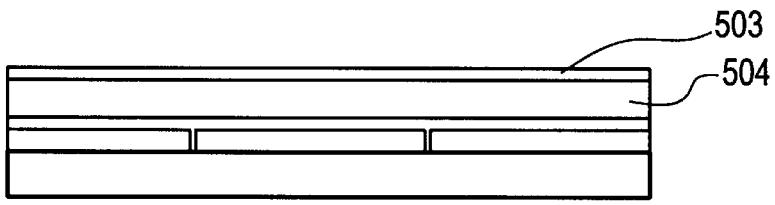

The step of forming the first microcrystalline silicon film 503 was continuously conducted subsequent to the step of forming the substantially intrinsic amorphous silicon film 504. The conditions for the film formation were the same as those in the formation of the second microcrystalline silicon film 505a, and the film formation was conducted by introducing only $SiH_4$ gas and $H_2$ gas into the reaction chamber. (FIG. 5E)

Figure 5F:
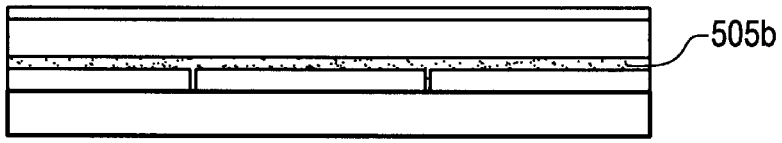

Since the B element introduced into the second microcrystalline silicon film 505a does not function as a p type impurity element as it is, an activation step by a heat treatment is necessary. The heat treatment can be conducted in the air, a nitrogen atmosphere or a hydrogen atmosphere at a temperature of from 200 to 450° C., preferably from 300 to 400° C. In this example, the heat treatment at 300° C. form 2 hours was conducted. At this time, the conductivity of the first microcrystalline silicon film 503 was also increased, and it was confirmed that it exhibit higher n type conductivity. By conducting the heat treatment, a microcrystalline silicon film 505b having p type conductive type was obtained. (FIG. 5F)

Figure 5G:
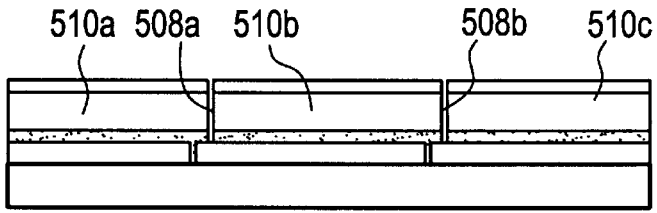

Second openings 508a and 508b were formed in the first microcrystalline silicon film 503, the substantially intrinsic amorphous silicon film 504, and the second microcrystalline silicon film 505b, at the positions adjacent to the first openings 507a and 507b by the laser scribing method, so as to form plural photoelectric conversion layers 510a, 510b and 510c. (FIG. 5G)

Figure 5H:
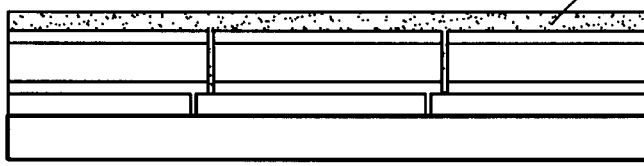

A second electrode 506 was formed to cover the first microcrystalline silicon film 503 and the second openings 508. The second electrode 506 can be formed by the known method represented by the vacuum vapor deposition method and the sputtering method. Specifically, a single film composed of a metallic material, such as Ti, Al, Ag and Cr, or an electrode obtained by laminating plural materials can be used. In this example, Ti was formed into a film having a thickness of 300 nm by the sputtering method. (FIG. 5H)

Figure 5I:
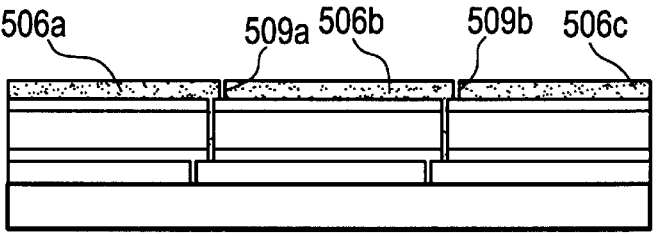

Finally, third openings 509a and 509b were formed at the positions adjacent to the second openings 508a and 508b to separate the second electrode 506 into plural second electrodes 506a, 506b and 506c. (FIG. 5I)

According to the above-described steps, a solar cell was obtained. The process for producing a solar cell shown in this example comprises a step of forming a first electrode, a step of forming a second microcrystalline silicon film, a step of injecting a p type conductive type determining impurity element into the second microcrystalline silicon film, a step of forming a first microcrystalline silicon film, a step of forming a substantially intrinsic amorphous silicon film, a step of forming a first microcrystalline silicon film, a step of heating the first and second microcrystalline silicon films and the substantially intrinsic amorphous silicon film, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 9

An example of the invention will be described according to the production process of a solar cell shown in FIGS. 4a to 4h. In this example, an organic resin film was used as a substrate 401. Preferred organic resin film materials for producing this example include polyethyleneterephthalate, polyethylenenaphthalate, polyethersulfone, polyimide and aramid. In this example, a polyethylenenaphthalate (PEN) film having a thickness of 80 μm was used.

A first electrode is formed on the surface of the substrate 401. The first electrode 402 was formed by a known method represented by a vacuum vapor deposition method and a sputtering method. It is preferred that the first electrode 402 is formed with a light reflective metallic electrode selected from Ag, Ti, Cr, Ni and Pt. The necessary thickness thereof is about from 100 to 300 nm, but a thickness outside this range can be used irrespective to the constitution of the invention. In this example, Ti was formed in a thickness of 20 nm by a sputtering method. (FIG. 4A)

Microcrystalline silicon layers and an amorphous silicon layer to be a photoelectric conversion layer was formed on the surface of the first electrode 402. A first microcrystalline silicon layer 403 was formed by a plasma CVD process without adding a p type or n type conductive type determining impurity element; a substantially intrinsic amorphous silicon layer 404 was formed by a plasma CVD process; and a second microcrystalline silicon layer 405a was formed by a plasma CVD process without adding a p type or n type conductive type determining impurity element. (FIG. 4B)

FIG. 6 is a conception diagram of a leaf type plasma CVD apparatus used in this example. The plasma CVD apparatus may have a constitution according to the conventional technique and comprises a loading and unloading chamber 602 of a substrate and plural reaction chambers 603a, 603b and 603c around a transfer chamber 601 of a substrate, and a plasma generating means 604 is provided in each of the reaction chambers. While not shown in the figure, in each of the reaction chambers, an evacuation means for maintaining the reaction chamber under reduced pressure, and a means for holding and heating the substrate are provided.

In the invention, the first and second microcrystalline silicon films and the substantially intrinsic amorphous silicon film are formed by supplying only $SiH_4$ gas and $H_2$ gas, and thus they can be produced in one reaction chamber using the same discharge means. Therefore, when the leaf type plasma CVD apparatus shown in FIG. 6 was used, the same film formation could be conducted in each of the plural reaction chambers.

While not used in this example, an in-line type plasma CVD apparatus according to the conventional technique comprising a loading and unloading chamber of a substrate and one or plural reaction chambers, which are connected in series, can also be used.

In this step, the first microcrystalline silicon film 403 and the second microcrystalline silicon film 405a formed without adding a p type or n type conductive type determining impurity element were formed under the same conditions. Specifically, the film formation was conducted at an $SiH_4$ flow amount of 2 sccm, an $H_2$ flow amount of 200 sccm, a pressure of 133 Pa, and an RF (13.56 MHz) electric power of 120 $mW/cm^2$. The film formation conditions of the microcrystalline silicon layer are basically known techniques and are not limited to the above-described conditions. The substrate temperature was maintained to 160° C.

As examples of the ranges of the film formation conditions, the ratio of $SiH_4/H_2$ may be from 1/30 to 1/100, the pressure may be from 5 to 266 Pa, the RF power density may be from 10 to 250 $mW/cm^2$, and the substrate temperature may be from 80 to 300° C. The accumulated thickness of the first microcrystalline silicon film 403 may be from 10 to 80 nm, and the accumulated thickness of the second microcrystalline silicon film 405a may be from 5 to 50 nm. In this example, the accumulated thickness of first microcrystalline silicon film 403 was 30 nm, and the accumulated thickness of the second microcrystalline silicon film 405a was 25 nm.

The substantially intrinsic amorphous silicon film 404 was formed at an $SiH_4$ flow amount of 40 sccm, an $H_2$ flow amount of 360 sccm, a pressure of 133 Pa, and an RF (13.56 MHz) electric power of 48 $mW/cm^2$. The substrate temperature at this time was maintained at 160° C. The film formation conditions of the amorphous silicon layer are basically known techniques and are not limited to the above-described conditions.

As examples of the ranges of the film formation conditions, the ratio of $H_2$ gas with respect to $SiH_4$ gas may be from 0 to 95%, the pressure may be from 5 to 266 Pa, the RF power density may be from 5 to 100 $mw/cm^2$, and the substrate temperature may be from 80 to 350° C. The thickness is preferably from 100 to 2,000 nm. In this example, the thickness was 1,000 nm.

Instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

A step of injecting a p type conductive type determining impurity element to the second microcrystalline silicon film 405a to form a p type microcrystalline silicon film 405b was conducted. As an impurity capable of controlling the valence electron to p type, an element of the group IIIb in the periodic table, such as boron (B), aluminum (Al), gallium (Ga) and indium (In), may be added. In the ion doping method, a gas of a hydrogenated compound, a chloride or a fluoride of the impurity elements is formed into plasma, and the thus-generated impurity element is ionized to be injected to the substrate by applying an electric field in the direction, by which the ion is accelerated towered the substrate. In this example, $B_2H_6$ gas was used. The dose amount may be from $2.0 \times 10^{13}$ to $5.0 \times 10^{15}$ per square centimeter. In this example the dose amount was $1.0 \times 10^{14}$ per square centimeter. (FIG. 4C)

In the ion doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 keV. In this example, the accelerated voltage was 15 keV. When B was injected under the conditions of a dose amount of $1.0 \times 10^{14}$ per square centimeter and an accelerated voltage of 10 keV, the concentration of B injected into the film was measured by the secondary ion mass analysis, and a concentration of $5 \times 10^{19}$ per cubic centimeter as a concentration at a peak value.

Furthermore, the p type impurity element may be injected to the second microcrystalline silicon film and the region of the substantially intrinsic amorphous silicon film in contact with the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p impurity element must be precisely controlled by using a computer to obtain such density gradient. In the invention, only the accelerated voltage is controlled in the process of the plasma doping method to obtain the density gradient.

Since B element injected as it is does not function as a p type impurity element, a step of activation by a heat treatment is necessary. The heat treatment can be conducted in the air, a nitrogen atmosphere or a hydrogen atmosphere at a temperature of from 150 to 450° C., preferably from 200 to 400° C. In this example, the heat treatment was conducted at 200° C. for 2 hours. (FIG. 4D)

The change of the conductivity of the microcrystalline silicon film formed on a glass substrate has been confirmed by experimentation. The results are shown in FIG. 8. The conductivity of the microcrystalline silicon film formed with $SiH_4$ gas and $H_2$ gas immediately after the film formation was about $5×10^{-4}$ S/cm, and it was increased to from $5×10^{-3}$ S/cm to $5×10^1$ S/cm by injecting a p type impurity followed by heating according to the invention.

The data of FIG. 8, which are the results when the dose amount was $1×10^{14}$ per square centimeter, show that the conductivity was increased to $1.2×10^{-2}$ by a heat treatment at 200° C. Furthermore, it was confirmed that when the film, to which no impurity element was injected by the ion doping method, was subjected to the heat treatment, its conductivity was increased to about from $5×10^{-3}$ to $5×10^{-2}$ S/cm. It was also confirmed that the microcrystalline silicon film, to which no impurity element was added, had the n type conductivity.

According to the above-described steps, the photoelectric conversion layer composed of the first n type microcrystalline silicon film, the substantially intrinsic amorphous silicon film, and the second p type microcrystalline silicon film were formed.

Furthermore, an integration process was conducted, in which the photoelectric conversion layer and the electrode were divided within the same substrate surface to connect in series. The integration process can be conducted according to the conventional technique and comprises a step of forming an opening in the photoelectric conversion layer and the electrode by the laser scribing method, and a step of forming an insulating resin by the screen printing method. The matters relating to the design of integration process may accord to the known technique and thus are not described in detail here.

First openings 407a and 407b are openings for separation and insulation formed in the photoelectric conversion layer and the first electrode. These openings are to form plural unit cells within the same substrate surface. Second openings 408a and 408b are formed at the positions adjacent to the first openings 407a and 407b, and they are to connect the first electrode and the second electrode adjacent to each other. The formation of these openings was conducted by the laser scribing method. (FIG. 4E)

After the formation of the first openings and the second openings, an insulating resin was printed by the screen printing method. First insulating resin regions 409a and 409b, and second insulating resin regions 411a and 411b were formed with the insulating resin. The first insulating resin regions 409a and 409b were formed on the first openings 407a and 407b to fill in them, and the second insulating resin regions 411a and 411b were formed at the positions adjacent to the second openings 408a and 408b. The insulating resin may be a conventional one, which is an acryl series resin or a urethane series resin, and is preferably those capable of being baked at a Temperature of about 200° C. The thickness of the insulating resin is not particularly limited. In this example, the thickness of the insulating resin was 20 μm. (FIG. 4F)

A second electrode 406 was formed to cover the second microcrystalline silicon film 405b, the first insulating resin regions 409a and 409b, and the second insulating resin regions 411a and 411b. The second electrode 406 is a transparent electrode, and can be formed by a known method represented by the vacuum vapor deposition method and the sputtering method. Specifically, $In_2O_3$, $SnO_2$, ZnO and an ITO film may be used. In this example, an ITO film was formed by the sputtering method to have a thickness of 70 nm. (FIG. 4G)

Third openings 412a and 412b to separate the second electrode 406 to the respective unit cells were formed by the laser scribing method in the second insulating resin regions at the positions adjacent to second openings. (FIG. 4H)

Since the second electrode 406 has a relatively high resistance, the provision of an auxiliary electrode 413 results in a more preferred embodiment. The auxiliary electrodes 413a and 413b are formed in intimate contact with the second electrode 406 to cover the second openings 408a and 408b. The auxiliary electrodes are formed with a metallic material having high conductivity. In this example, silver (Ag) was formed into a comb form by the screen printing method. (FIG. 4H)

According to the above-described steps, a solar cell in which plural unit cells 410a, 410b and 410c were connected in series was obtained. The process for producing a solar cell shown in this example comprises a step of forming a first electrode, a step of forming a first microcrystalline silicon film, a step of forming a substantially intrinsic amorphous silicon film, a step of forming a second microcrystalline silicon film, a step of injecting a p type conductive type determining impurity element into the second microcrystalline silicon film, a step of heating the first and second microcrystalline silicon films and the substantially intrinsic amorphous silicon film, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 10

An example of the invention will be described according to the production process of a solar cell shown in FIGS. 3A to 3H. In this example, an organic resin film was used as a substrate 301. Preferred organic resin film materials for producing this example include polyethyleneterephthalate, polyethylenenaphthalate, polyethersulfone, polyimide and aramid. In this example, a polyethylenenaphthalate (PEN) film having a thickness of 100 μm was used.

A first electrode is formed on the surface of the substrate 301. The first electrode 302 was formed by a known method represented by a vacuum vapor deposition method and a sputtering method. It is preferred that the first electrode 302 is formed with a light reflective metallic electrode selected from Al, Ag, Ti, Cr, Ni and Pt. The necessary thickness thereof is about from 100 to 300 nm, but a thickness outside this range can be used irrespective to the constitution of the invention. In this example, Al was formed in a thickness of 150 nm by a sputtering method, and further Ti was formed on the surface of Al in a thickness of 20 nm by the sputtering method to form the first electrode. (FIG. 3A)

A photoelectric conversion layer was formed in intimate contact with the first electrode 302. The photoelectric conversion layer was produced by forming, in this order from the first electrode side, a first microcrystalline silicon film 303, a substantially intrinsic amorphous silicon film 304, and a second microcrystalline silicon film 305a, by the plasma CVD method. The first and second microcrystalline silicon films were formed from $SiH_4$ and $H_2$ without adding a p type or n type conductive type determining impurity element. (FIG. 3B)

FIG. 6 is a conception diagram of a leaf type plasma CVD apparatus used in this example. The plasma CVD apparatus may have a constitution according to the conventional technique and comprises a loading and unloading chamber 602 of a substrate and plural reaction chambers 603a, 603b and 603c ground a transfer chamber 601 of a substrate, and a plasma generating means 604 is provided in each of the reaction chambers. While not shown in the figure, in each of the reaction chambers, an evacuation means for maintaining the reaction chamber under reduced pressure, and a means for holding and heating the substrate are provided.

In the invention, the first and second microcrystalline silicon films and the substantially intrinsic amorphous silicon film are formed by supplying only $SiH_4$ gas and $H_2$ gas, and thus they can be produced in one reaction chamber using the same discharge means. Therefore, when the leaf type plasma CVD apparatus shown in FIG. 6 was used, the same film formation could be conducted in each of the plural reaction chambers.

While not used in this example, an in-line type plasma CVD apparatus according to the conventional technique comprising a loading and unloading chamber of a substrate and one or plural reaction chambers, which are connected in series, can also be used.

In this step, the first microcrystalline silicon film 303 and the second microcryszalline silicon film 305a formed without adding a p type or n type conductive type determining impurity element were formed under the same conditions. Specifically, the film formation was conducted at an $SiH_4$ flow amount of 2 sccm, an $H_2$ flow amount of 200 sccm, a pressure of 133 Pa, and an RF (13.56 MHz) electric power of 120 mW/cm². At this time, the substrate temperature was maintained to 160° C.

Before the film formation, the reaction chambers were thoroughly evacuated to have a vacuum degree of $5 \times 10^{-6}$ Torr. The film formation conditions of the microcrystalline silicon layer are basically known techniques and are not limited to the above-described conditions. As examples of the ranges of the film formation conditions, the ratio of $SiH_4/H_2$ may be from 1/30 to 1/100, the pressure may be from 5 to 266 Pa, the RF power density may be from 10 to 250 mW/cm², and the substrate temperature may be from 80 to 300° C. The thickness of the first microcrystalline silicon film 303 may be from 10 to 80 nm, and the thickness of the second microcrystalline silicon film 305a may be from 5 to 50 nm. In this example, the thickness of the first microcrystalline silicon film 303 was 30 nm, and the thickness of the second microcrystalline silicon film 305a was 25 nm.

The substantially intrinsic amorphous silicon film 304 was formed at an $SiH_4$ flow amount of 40 sccm, an $H_2$ flow amount of 360 sccm, a pressure of 133 Pa, and an R(13.56 MHz) electric power of 48 mW/cm². The substrate temperature at this time was maintained at 160° C. The film formation conditions of the amorphous silicon layer are basically known techniques and are not limited to the above-described conditions. As examples of the ranges of the film formation conditions, the ratio of $H_2$ gas with respect to $SiH_4$ gas may be from 0 to 90%, the pressure may be from 5 to 266 Pa, the RF power density may be from 5 to 100 mW/cm², and the substrate temperature may be from 80 to 350° C. The thickness is preferably from 100 to 2,000 nm. In this example, the thickness was 1,000 nm.

Instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

After the above-described steps, an integration process was conducted, in which the photoelectric conversion layer and the electrode were divided within the same substrate surface to connect in series. The integration process can be conducted according to the conventional technique and comprises a step of forming an opening in the photoelectric conversion layer and the electrode by the laser scribing method, and a step of forming an insulating resin by the screen printing method. The matters relating to the design of integration process may accord to the known technique and thus are not described in detail here.

First openings 307a and 307b are openings for separation and insulation formed in the photoelectric conversion layer and the first electrode. These openings are to form plural unit cells within the same substrate surface. Second openings 308a and 308b are formed at the positions adjacent to the first openings 307a and 307b, and they are to connect the first electrode and the second electrode adjacent to each other. The formation of these openings was conducted by the laser scribing method. (FIG. 3C)

After the formation of the first openings and the second openings, an insulating resin was printed by the screen printing method. First insulating resin regions 309a and 309b, and second insulating resin regions 311a and 311b were formed with the insulating resin. The first insulating resin regions 309a and 309b were formed on the first openings 307a and 307b to fill in them, and the second insulating resin regions 311a and 311b were formed at the positions adjacent to the second openings 308a and 308b. The insulating resin may be a conventional one, which is an acryl series resin or a urethane series resin, and is preferably those capable of being baked at a temperature of about 200° C. The thickness of the insulating resin is not particularly limited. In this example, the thickness of the insulating resin was 20 μm. (FIG. 3D)

A second electrode 306 was formed to cover the second microcrystalline silicon film 305a, the first insulating resin regions 309a and 309b, and the second insulating resin regions 311a and 311b. The second electrode 306 is a transparent electrode, and can be formed by a known method represented by the vacuum vapor deposition method and the sputtering method. Specifically, $SnO_2$, ZnO and an ITO film may be used. In this example, an ITO film was formed by the sputtering method to have a thickness of 70 nm. (FIG. 3A)

Third openings 312a and 312b to separate the second electrode 306 to the respective unit cells were formed by the laser scribing method in the second insulating resin regions at the positions adjacent to second openings. (FIG. 3F)

Since the second electrode 306 has a relatively high resistance, the provision of an auxiliary electrode 313 results in a more preferred embodiment. The auxiliary electrodes 313a and 313b are formed in intimate contact with the second electrode 306 to cover the second openings 308a and 308b. The auxiliary electrodes are formed with a metallic material having high conductivity. In this example, silver (Ag) was formed into a comb form by the screen printing method. (FIG. 3F)

After the above-described steps, a step of injecting a p type conductive type determining impurity element from the surface of the second electrode to the second microcrystalline silicon film 305a by the ion doping method to form a p type microcrystalline silicon film 305b was conducted. As an impurity capable of controlling the valence electron to p type, an element of the group IIIb in the periodic table, such as boron (B), aluminum (Al), gallium (Ga) and indium (In), may be added. In the ion doping method, a gas of a hydrogenated compound, a chloride or a fluoride of the impurity elements is formed into plasma, and the thus-generated impurity element is ionized to be injected to the substrate by applying an electric field in the direction, by which the ion is accelerated towered the substrate.

In this example, $B_2H_6$ gas was used. The dose amount may be from $2.0 \times 10^{13}$ to $5.0 \times 10^{15}$ per square centimeter. In thins example the dose amount was $1.0 \times 10^{14}$ per square centimeter. (FIG. 3G)

In the ion doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 kev. In this example, the accelerated voltage was 15 keV. When B was injected under the conditions of a dose amount of $1.0 \times 10^{14}$ per square centimeter and an accelerated voltage of 10 keV, the concentration of B injected into the film was measured by the secondary ion mass analysis, and a concentration of $5 \times 10^{19}$ per cubic centimeter as a concentration at a peak value.

Furthermore, the p type impurity element may be injected to the second microcrystalline silicon film and the region of the substantially intrinsic amorphous silicon film in contact with the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p impurity element must be precisely controlled by using a computer to obtain such density gradient. In the invention, only the accelerated voltage is controlled in the process of the plasma doping method to obtain the density gradient.

Since B element injected as it is does not function as a p type impurity element, a step of activation by a heat treatment is necessary. The heat treatment can be conducted in the air, a nitrogen atmosphere or a hydrogen atmosphere at a temperature of from 150 to 450° C., preferably from 200 to 400° C. In this example, the heat treatment was conducted at 200° C. for 2 hours. (FIG. 3H)

The change of the conductivity of the microcrystalline silicon film formed on a glass substrate has been confirmed by experimentation. The results are shown in FIG. 8. The conductivity of the microcrystalline silicon film formed with $SiH_4$ gas and $H_2$ gas immediately after the film formation was about $5 \times 10^{-4}$ S/cm, and it was increased to from $5 \times 10^{-3}$ S/cm to $5 \times 10^1$ S/cm by injecting a p type impurity followed by heating according to the invention.

The data of FIG. 8, which are the results when the dose amount was $1 \times 10^{14}$ per square centimeter, show that the conductivity was increased to $1.2 \times 10^{-2}$ by a heat treatment at 150° C., and increased to $1.5 \times 10^{-1}$ by a heat treatment at 200° C. Furthermore, it was confirmed that when the film, to which no impurity element was injected by the ion doping method, was subjected to the heat treatment, its conductivity was increased to about from $5 \times 10^{-3}$ to $5 \times 10^{-2}$ S/cm. It was also confirmed that the microcrystalline silicon film, to which no impurity element was added, had the n type conductivity.

Because the microcrystalline silicon film formed without adding a p type or n type conductive type determining impurity element exhibits n type conductivity, a photoelectric conversion layer composed of the first n type microcrystalline silicon film, the substantially intrinsic amorphous silicon film, and the second p type microcrystalline silicon film was formed, and thus a solar cell was produced.

According to the above-described steps, a solar cell in which plural unit cells 310a, 310b and 310c were connected in series was obtained. The process for producing a solar cell shown in this example comprises a step of forming a first electrode, a step of forming a first microcrystalline silicon film, a step of forming a substantially intrinsic amorphous silicon film, a step of forming a second microcrystalline silicon film, a step of injecting a p type conductive type determining impurity element into the second microcrystalline silicon film, a step of heating the first and second microcrystalline silicon films and the substantially intrinsic amorphous silicon film, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

EXAMPLE 11

Another example of the invention will be described according to the production process of a solar cell shown in FIGS. 3A to 3H. A substrate 301 comprises an organic resin material. In this example, a polyethylenenaphthalate (PEN) substrate having a thickness of 80 μm was used. Other than this material, materials such as polyethyleneterephthalate, polyethersulfone, polyimide and aramid can be applied.

A first electrode is formed on the surface of the substrate 301. The first electrode 302 was formed by a known method represented by a vacuum vapor deposition method and a sputtering method. It is preferred that the first electrode 302 is formed with a light reflective metallic electrode selected from Al, Ag, Ti, Cr, Ni and Pt. The necessary thickness thereof is about from 100 to 300 nm, but a thickness outside this range can be used irrespective to the constitution of the invention. In this example, Ti was formed in a thickness of 200 nm by a sputtering method. (FIG. 3A)

Microcrystalline silicon layers and an amorphous silicon layer to be a photoelectric conversion layer was formed on the surface of the first electrode 302. A first microcrystalline silicon layer 303 was formed by a plasma CVD process without adding a p type or n type conductive type determining impurity element; a substantially intrinsic amorphous silicon layer 304 was formed by a plasma CVD process; and a second microcrystalline silicon layer 305a was formed by a plasma CVD process without adding a p type or n, type conductive type determining impurity element. (FIG. 3B)

FIG. 6 is a conception diagram of a leaf type plasma CVD apparatus used in this example. The plasma CVD apparatus may have a constitution according to the conventional technique and comprises a loading and unloading chamber 602 of a substrate and plural reaction chambers 603a, 603b and 603c around a transfer chamber 601 of a substrate, and a plasma generating means 604 is provided in each of the reaction chambers. While not shown in the figure, in each of the reaction chambers, an evacuation means for maintaining the reaction chamber under reduced pressure, and a means for holding and heating the substrate are provided.

In the invention, the first and second microcrystalline silicon films and the substantially intrinsic amorphous silicon film are formed by supplying only $SiH_4$ gas and $H_2$ gas, and thus they can be produced in one reaction chamber using the same discharge means. Therefore, when the leaf type plasma CVD apparatus shown in FIG. 6 was used, the same film formation could be conducted in each of the plural reaction chambers.

While not used in this example, an in-line type plasma CVD apparatus according to the conventional technique comprising a loading and unloading chamber of a substrate and one or plural reaction chambers, which are connected in series, can also be used.

According to the invention, because the first microcrystalline silicon film 303, the substantially intrinsic amorphous silicon film 304, and the second microcrystalline silicon film 305a can be produced with the same $SiH_4$ gas and $H_2$ gas in the same reaction chamber, they can be continuously produced only by changing the conditions on the film formation. Specifically, the mixing ratio of the gases, the discharge electric power, and the reaction gas pressure are adjusted.

In this step, the first microcrystalline silicon film 303 and the second microcrystalline silicon film 305a formed without adding a p type or n type conductive type determining impurity element were formed under the same conditions. Specifically, the film formation was conducted at an $SiH_4$ flow amount of 4 sccm, an $H_2$ flow amount of 400 sccm a pressure of 133 Pa, and an RF (13.56 MHz) electric power of 120 mw/cm². At this time, the substrate temperature was maintained to 160° C. The film formation conditions of the microcrystalline silicon layer are basically known techniques and are not limited to the above-described conditions. As examples of the ranges of the film formation conditions, the ratio of $SiH_4/H_2$ may be from 1/30 to 1/100, the pressure may be from 5 to 266 Pa, the RF power density may be from 10 to 250 mW/cm², and the substrate temperature may be from 80 to 300° C.

The thickness of the first microcrystalline silicon film 303 is determined by the accumulation time based on the accumulation rate previously obtained. In this example, the thickness of the first microcrystalline silicon film was 30 nm. The formation of the substantially intrinsic amorphous silicon film 304 was conducted without terminating the supply of the reaction gas of $SiH_4$ gas and $H_2$ gas and the glow discharge. Specifically, the $SiH_4$ gas flow amount was increased from 4 sccm to 40 sccm, the $H_2$ gas flow amount was reduced from 400 sccm to 360 sccm, and the RF electric power density was changed from 120 mW/cm² to 48 mW/cm². The changing amounts of the gas flow amounts and the RF electric power density depending on time are matters of design, and thus they are not described here. The substrate temperature at this time was maintained to 160° C., and the pressure was maintained to 133 Pa.

The conditions for the film formation of the amorphous silicon film are basically the conventional technique, and they are not limited to the above-described conditions. Examples of the applicable conditions include that the ratio of $H_2$ gas with respect to $SiH_4$ gas may be from 0 to 95%, the pressure may be from 5 to 266 Pa, the RF electric power density may be from 5 to 100 mW/cm², and the substrate temperature may be from 80 to 350° C.

The thickness of the substantially intrinsic amorphous silicon film 304 is determined by the accumulation time based on the accumulation rate The thickness of the substantially intrinsic amorphous silicon film 304 in this example was 1,000 nm. The formation of the second microcrystalline silicon film 305a was conducted without terminating the supply of the reaction gas of $H_2$ gas and $SiH_4$ gas and the glow discharge.

Specifically, the $SiH_4$ gas flow amount was reduced from 40 sccm to 4 sccm, the $H_2$ gas flow amount was increased from 360 sccm to 400 sccm, and the RF electric power density was changed from 4 mW/cm² to 120 mW/cm². The substrate temperature was maintained to 160° C., and the pressure was maintained to 133 Pa. The thickness of the second microcrystalline silicon film 305a was set to 25 nm.

In the above-described steps, instead of the substantially intrinsic amorphous silicon film, an amorphous silicon carbide film, an amorphous silicon germanium film, or an amorphous silicon tin film may be formed by introducing, in addition to $SiH_4$ gas, a gas composed of a hydrogenated compound, a fluoride or a chloride of carbon (C), germanium (Ge) or tin (Sn).

By employing the procedures described in this example, a junction structure was obtained, in which the structure was continuously changed from the microcrystalline silicon film to the amorphous silicon film, and from the amorphous silicon film to the microcrystalline silicon film.

After the above-described steps, an integration process was conducted, in which the photoelectric conversion layer and the electrode were divided within the same substrate surface to connect in series. The integration process can be conducted according to the conventional technique and comprises a step of forming an opening in the photoelectric conversion layer and the electrode by the laser scribing method, and a step of forming an insulating resin by the screen printing method. The matters relating to the design of integration process may accord to the known technique and thus are not described in detail here.

First openings 307a and 307b are openings for separation and insulation formed in the photoelectric conversion layer and the first electrode. These openings are to form plural unit cells within the same substrate surface. Second openings 308a and 308b are formed at the positions adjacent to the first openings 307a and 307b, and they are to connect the first electrode and the second electrode adjacent to each other. The formation of these openings was conducted by the laser scribing method. (FIG. 3C)

After the formation of the first openings and the second openings, an insulating resin was printed by the screen printing method. First insulating resin regions 309a and 309b, and second insulating resin regions 311a and 311b were formed with the insulating resin. The first insulating resin regions 309a and 309b were formed on the first openings 307a and 307b to fill in them, and the second insulating resign regions 311a and 311b were formed at the positions adjacent to the second openings 308a and 308b. The insulating resin, may be a commercially available one, which is an acryl series resin or a urethane series resin, and is preferably those capable of being baked at a temperature of about 200° C. The thickness of the insulating resin is not particularly limited. In this example, the thickness of the insulating resin was 20 μm. (FIG. 3D)

A second electrode 306 was formed to cover the second microcrystalline silicon film 305a, the first insulating resin regions 309a and 309b, and the second insulating resin regions 311a and 311b. The second electrode 306 is a transparent electrode, and can be formed by a known method represented by the vacuum vapor deposition method and the sputtering method. Specifically, $SnO_2$, ZnO and an ITO film may be used. In this example, an ITO film was formed by the sputtering method to have a thickness of 70 nm. (FIG. 3E)

Third openings 311a and 311b to separate the second electrode 306 to the respective unit cells were formed in the second insulating resin regions at the positions adjacent to second openings. (FIG. 3F)

Since the second electrode 306 has a relatively high resistance, the provision of an auxiliary electrode 313a and 313b results in a more preferred embodiment. The auxiliary electrodes are formed in intimate contact with the second electrode 306 to cover the second openings 308a and 308b. The auxiliary electrodes are formed with a metallic material having high conductivity. In this example, silver (Ag) was formed into a comb form by the screen printing method. (FIG. 3F)

After the above-described steps, a step of injecting a p type conductive type determining impurity element from the surface of the second electrode to the second microcrystalline silicon film 305a by the ion doping method to form a p type microcrystalline silicon film 305b was conducted. As an impurity capable of controlling the valence electron to p type, an element of the group IIIb in the periodic table, such as boron (B), aluminum (Al) gallium (Ga) and indium (In), may be added. In the ion doping method, a gas of a hydrogenated compound, a chloride or a fluoride of the impurity elements is formed into plasma, and the thus-generated impurity element is ionized to be injected to the substrate by applying an electric field in the direction, by which the ion is accelerated towered the substrate. In this example, $B_2H_6$ gas was used. The dose amount may be from $2.0\times10^{13}$ to $5.0\times10^{15}$ per square centimeter. In this example the dose amount was $1.0\times10^{14}$ per square centimeter. (FIG. 3G)

In the ion doping method, a concentration distribution of the injected element is formed in the depth direction, depending on the accelerated voltage, and this value must be properly controlled. In the case of a solar cell, while the optimum conditions vary depending on the thickness of the p type layer, the accelerated voltage is set within the range of from 5 to 25 keV. In this example, the accelerated voltage was 10 keV. When B was injected under the conditions of a dose amount of $1.0\times10^{14}$ per square centimeter and an accelerated voltage of 10 kev, the concentration of B injected into the film was measured by the secondary ion mass analysis, and a concentration of $5\times10^{19}$ per cubic centimeter as a concentration at a peak value.

As a result o:E experimentation, the amount of B injected into the film changed in substantially proportion to the dose amount, and when the dose amount was $1.0\times10^{15}$ per square centimeter, the concentration of $5\times10^{20}$ per cubic centimeter.

Furthermore, the p type impurity element may be injected to the second microcrystalline silicon film and the region of the substantially intrinsic amorphous silicon film in contact with the second microcrystalline silicon film by increasing the accelerated voltage. In the technical field of a solar cell, it is a known technique that a p type impurity is doped to the p/i boundary to have density gradient, so that the junction property of the boundary between them is improved. In the conventional technique, a gas containing a slight amount of a p impurity element must be precisely controlled by using a computer to obtain such density gradient. In the invention, only the accelerated voltage is controlled in the process of the plasma doping method to obtain the density gradient.

Since B element injected as it is does not function as a p type impurity element, a step of activation by a heat treatment is necessary. The heat treatment can be conducted in the air, a nitrogen atmosphere or a hydrogen atmosphere at a temperature of from 150 to 450° C., preferably from 200 to 400° C. In this example, the heat treatment was conducted at 200° C. for 2 hours. (FIG. 3H)

The change of the conductivity of the microcrystalline silicon film formed on a glass substrate has been confirmed by experimentation. The results are shown in FIG. 8. The conductivity of the microcrystalline silicon film formed with $SiH_4$ gas and $H_2$ gas immediately after the film formation was about $5\times10^{-4}$ S/cm, and it was increased to from $5\times10^{-3}$ S/cm to $5\times10^{1}$ S/cm by injecting a p type impurity followed by heating according to the invention. The data of FIG. 8, which are the results when the dose amount was $1\times10^{14}$ per square centimeter, show that the conductivity was increased to $1.2\times10^{-2}$ by a heat treatment at 150° C., and increased to $1.5\times10^{-1}$ by a heat treatment at 200° C. Furthermore, it was confirmed that when the film, to which no impurity element was injected by the ion doping method, was subjected to the heat treatment, its conductivity was increased to about from $5\times10^{-3}$ to $5\times10^{-2}$ S/cm. It was also confirmed that the microcrystalline silicon film, to which no impurity element was added, had the n type conductivity.

Because the microcrystalline silicon film formed without adding a p type or n type conductive type determining impurity element exhibits n type conductivity, a photoelectric conversion layer composed of the first n type microcrystalline silicon film, the substantially intrinsic amorphous silicon film, and the second p type microcrystalline silicon film was formed, and thus a solar cell was produced.

According to the above-described steps, a solar cell in which plural unit cells 310a, 310b and 310c were connected in series was obtained. The process for producing a solar cell shown in this example comprises a step of forming a first electrode, a step of forming a first microcrystalline silicon film, a step of forming a substantially intrinsic amorphous silicon film, a step of forming a second microcrystalline silicon film, a step of injecting a p type conductive type determining impurity element into the second microcrystalline silicon film, a step of heating the first and second microcrystalline silicon films and the substantially intrinsic amorphous silicon film, and a step of forming a second electrode. By adding a step of patterning the first or second electrode by a known method to arrange it at the prescribed position on the surface of the substrate, this process can be applied to the production of a serial connection structure of a solar cell, an image sensor and a photo sensor.

According to the invention, by the step of forming an amorphous semiconductor layer and a microcrystalline semiconductor layer and the step of injecting an impurity to the microcrystalline semiconductor layer are separated, and thus the use of only one reaction chamber is substantially sufficient to simplify the constitution of the apparatus. Furthermore, the time required for transportation of a substrate, and the time required for introduction and evacuation of the gas can be reduced. On the other hand, even when a conventional separated multi-chamber type apparatus is employed, an impurity gas must not be introduced in the film formation process to prevent contamination of impurities in the film formation process, and thus plural substrate can be simultaneously processed in plural reaction chambers.

Furthermore, in the process for forming a p type or n type microcrystalline semiconductor film and a substantially intrinsic i type amorphous semiconductor film, the contamination of impurities must not be considered, and for example, the films may be continuously formed in one chamber for film formation. Specifically, as a p type and n type microcrystalline silicon films and a substantially intrinsic silicon film are produced by using only $SiH_4$ gas or $Si_2H_6$ gas, and $H_2$ gas, they can be formed with one glow plasma generation means provided in one reaction chamber. This makes possible to simplify the plasma CVD apparatus. Furthermore, a p type and n type microcrystalline silicon films and a substantially intrinsic silicon film can be continuously formed with maintaining glow discharge plasma. Therefore, according to the invention, a pin junction can be produced by a step of forming a first electrode, a step of forming a first microcrystalline silicon film, a step of forming a substantially intrinsic amorphous silicon film, a step of forming a second microcrystalline silicon film, a step of injecting a p type conductive type determining impurity element into the second microcrystalline silicon film, and a step of heating the first and second microcrystalline silicon films and the substantially intrinsic amorphous silicon film. Therefore, an n type impurity element, which is required in the conventional technique, is not necessary to be used.

Moreover, according to the invention, the first microcrystalline silicon film may includes oxygen in a concentration of from $1.0 \times 10^{18}/cm^3$ to $2.0 \times 10^{21}/cm^3$.

What is claimed is:

1. A process for producing a photoelectric conversion device comprising a substrate having an insulating surface, having laminated thereon a first electrode, a photoelectric conversion layer, and a second electrode,
    said photoelectric conversion layer being produced by a process comprising:
        a step of forming a first microcrystalline semiconductor film without adding an n type or p type impurity element, in intimate contact with said first electrode,
        a step of forming an intrinsic amorphous semiconductor film,
        a step of forming a second microcrystalline semiconductor film without adding an n type or p type impurity element,
        a step of injecting a p type conductive element from a surface of said second electrode provided in intimate contact with said second microcrystalline semiconductor film, into said second microcrystalline semiconductor film, and
        a step of heating, and
        said steps of forming said first and second microcrystalline semiconductor films and said intrinsic amorphous semiconductor film being conducted with one glow discharge plasma generation means provided in one reaction chamber.

2. A process for producing a photoelectric conversion device comprising one or plural unit cells connected to each other, said unit cell comprising a substrate having an insulating surface, having laminated thereon a first electrode, a photoelectric conversion layer, and a second electrode,
    said photoelectric conversion layer being produced by a process comprising:
        a step of forking a first microcrystalline semiconductor film without adding an n type or p type impurity element, in intimate contact with said first electrode,
        a step of forming an intrinsic amorphous semiconductor film,
        a step of forming a second microcrystalline semiconductor film without adding an n type or p type impurity element,
        a step of injecting a p type impurity element from a surface of said second electrode provided in intimate contact with said second microcrystalline semiconductor film, into said second microcrystalline semiconductor film, and vicinity of a boundary between said intrinsic amorphous semiconductor film and said second microcrystalline semiconductor film, and
        a step of heating, and
        said steps of forming said first and second microcrystalline semiconductor films and said intrinsic amorphous semiconductor film being conducted with one glow discharge plasma generation means provided in one reaction chamber.

3. A process for producing a photoelectric conversion device comprising one or plural unit cells connected to each other, said unit cell comprising a substrate having an insulating surfacer having laminated thereon a first electrode, a photoelectric conversion layer, and a second electrode,
    said photoelectric conversion layer being produced by a process comprising:
        a step of forming a first microcrystalline semiconductor film without adding an n type or p type impurity element,
        a step of forming an intrinsic amorphous semiconductor film,
        a step of forming a second microcrystalline semiconductor film without adding an n type or p type impurity element,
        a step of injecting a p type impurity element into said second microcrystalline semiconductor film, and
        a step of heating, and
        said steps of forming said first and second microcrystalline semiconductor films and said intrinsic amorphous semiconductor film being conducted with one glow discharge plasma generation means provided in one reaction chamber.

4. A process for producing a photoelectric conversion device comprising one or plural unit cells connected to each other, said unit cell comprising a substrate having an insulating surface, having laminated thereon a first electrode, a photoelectric conversion layer, and a second electrode,
    said photoelectric conversion layer being produced by a process comprising:
        a step of forming a first microcrystalline semiconductor film without adding an n type or p type impurity element,
        a step of forming an intrinsic amorphous semiconductor film,
        a step of forming a second microcrystalline semiconductor film without adding an n type or p type impurity element,
        a step of injecting a p type impurity element into said second microcrystalline semiconductor film, and vicinity of a boundary between said substantially intrinsic amorphous semiconductor film and said second microcrystalline semiconductor film, and
        a step of heating, and
        said steps of forming said first and second microcrystalline semiconductor films and said intrinsic amorphous semiconductor film being conducted with one glow discharge plasma generation means provided in one reaction chamber.

5. A process for producing a photoelectric conversion device comprising one or plural unit cells connected to each other, said unit cell comprising a substrate having an insulating surface, having laminated thereon a first electrode, a photoelectric conversion layer, and a second electrode, said photoelectric conversion layer being produced by a process comprising:
a step of forming a first microcrystalline semiconductor film without adding an n type or p type impurity element,
a step of forming an intrinsic amorphous semiconductor film,
a step of forming a second microcrystalline semiconductor film without adding an n type or p type impurity element,
a step of injecting a p type impurity element from a surface of said second microcrystalline semiconductor film, and
a step of heating, and
said steps of forming said first and second microcrystalline semiconductor films and said intrinsic amorphous semiconductor film being conducted with one glow discharge plasma generation means provided in one reaction chamber.

6. A process for producing a photoelectric conversion device as claimed in claim 1, 2, 3, 4 or 5, wherein said steps of forming said first and second microcrystalline semiconductor films and said intrinsic amorphous semiconductor film are continuously conducted with one glow discharge plasma generation means provided in one reaction chamber, with maintaining glow discharge plasma.

7. A process for producing a photoelectric conversion device comprising one or plural unit cells connected to each other, said unit cell comprising a substrate having an insulating surface, having laminated thereon a first electrode, a photoelectric conversion layer, and a second electrode, said photoelectric conversion layer being produced by a process comprising:
a step of forming a second microcrystalline semiconductor film without adding an n type or p type impurity element,
a step of injecting a p type impurity element into said second microcrystalline semiconductor film,
a step of forming an intrinsic amorphous semiconductor film,
a step of forming a first microcrystalline semiconductor film without adding an n type or p type impurity element, and
a step of subjecting said first and second microcrystalline semiconductor films and said intrinsic amorphous semiconductor film to a heat treatment, and
said steps of forming said first and second microcrystalline semiconductor films and said intrinsic amorphous semiconductor film being conducted with one glow discharge plasma generation means provided in one reaction chamber.

8. A process for producing a photoelectric conversion device comprising one or plural unit cells connected to each other, said unit cell comprising an organic resin substrate having laminated thereon a first electrode, a photoelectric conversion layer, and a second electrode, said photoelectric conversion layer being produced by a process comprising:
a step of forming a first microcrystalline semiconductor film without adding an n type or p type impurity element, in intimate contact with said first electrode,
a step of forming an intrinsic amorphous semiconductor film,
a step of forming a second microcrystalline semiconductor film without adding an n type or p type impurity element,
a step of injecting a p type impurity element into said second microcrystalline semiconductor film, and
a step of subjecting at least said first microcrystalline semiconductor film and said second microcrystalline semiconductor film to a heat treatment, to obtain a first n type microcrystalline semiconductor film and a second p type microcrystalline semiconductor film, and
said steps of forming said first and second microcrystalline semiconductor films and said intrinsic amorphous semiconductor film being conducted with one glow discharge plasma generation means provided in one reaction chamber.

9. A process for producing a photoelectric conversion device comprising one or plural unit cells connected to each other, said unit cell comprising an organic resin substrate having laminated thereon a first electrode, a photoelectric conversion layer, and a second electrode, said photoelectric conversion layer being produced by a process comprising:
a step of forming a first microcrystalline semiconductor film without adding an n type or p type impurity element, in intimate contact with said first electrode,
a step of forming an intrinsic amorphous semiconductor film,
a step of forming a second microcrystalline semiconductor film without adding an n type or p type impurity element,
a step of injecting a p type impurity element into said second microcrystalline semiconductor film, and vicinity of a boundary between said second microcrystalline semiconductor film and said intrinsic amorphous semiconductor film, and
a step of subjecting at least said first microcrystalline semiconductor film and said second microcrystalline semiconductor film to a heat treatment, to obtain a first n type microcrystalline semiconductor film and a second p type microcrystalline semiconductor film, and
said steps of forming said first and second microcrystalline semiconductor films and said intrinsic amorphous semiconductor film being conducted with one glow discharge plasma generation means provided in one reaction chamber.

10. A process for producing a photoelectric conversion device as claimed in claim 8 or 9, wherein said p type impurity element is injected from a surface of said second electrode provided in intimate contact with said second microcrystalline semiconductor film.

11. A process for producing a photoelectric conversion device as claimed in claim 8 or 9, wherein said steps of forming said first and second microcrystalline semiconductor films and said intrinsic amorphous semiconductor film are continuously conducted with one glow discharge plasma generation means provided in one reaction chamber, with maintaining glow discharge plasma.

12. A process for producing a photoelectric conversion device as claimed in claim 1, 2, 3, 4, 5, 7, 8 or 9, wherein said steps of forming said first and second microcrystalline semiconductor films and said intrinsic amorphous semiconductor film are conducted by using a plasma CVD apparatus.

13. A process for producing a photoelectric conversion device as claimed in claim 1, 2, 3, 4, 5, 7, 8 or 9, wherein said steps of forming said first and second microcrystalline semiconductor films and said intrinsic amorphous semiconductor film are conducted by using a plasma CVD apparatus, wherein said plasma CVD apparatus has plural reaction chambers, and said first and second microcrystalline films and said intrinsic amorphous semiconductor film are formed in each of said reaction chambers.

14. A process for producing a photoelectric conversion device as claimed in claim 1, 2, 3, 4, 5, 7, 8 or 9, wherein said steps of forming said first and second microcrystalline semiconductor films and said intrinsic amorphous semiconductor film are conducted by using a plasma CVD apparatus, wherein said plasma CVD apparatus has at least one substrate loading and unloading chamber and plural reaction chambers, and said first and second microcrystalline films and said substantially intrinsic amorphous semiconductor film are formed in each of said reaction chambers.

15. A process for producing a photoelectric conversion device as claimed in claim 1, 2, 3, 4, 5, 7, 8 or 9, wherein said steps of forming said first and second microcrystalline semiconductor films and said intrinsic amorphous semiconductor film are conducted by using a plasma CVD apparatus, wherein said plasma CVD apparatus has at least one substrate loading and unloading chamber, a transfer chamber, and plural reaction chambers, and said first and second microcrystalline films and said intrinsic amorphous semiconductor film are formed in each of said reaction chambers.

16. A process for producing a photoelectric conversion device as claimed in claim 1, 2, 3, 4, 5, 7, 8 or 9, wherein said first and second microcrystalline semiconductor films are microcrystalline silicon films, and said intrinsic amorphous semiconductor film is an amorphous silicon film.

17. A process for producing a photoelectric conversion device comprising, a step of forming a first electrode, a step of forming a first microcrystalline semiconductor film without adding an n type or p type impurity element, a step of forking an intrinsic amorphous semiconductor film, a step of forming a second microcrystalline semiconductor film without adding an n type or p type impurity element, a step of injecting a p type impurity element to said second microcrystalline semiconductor film, a step of subjecting said first and second microcrystalline semiconductor films and said intrinsic amorphous semiconductor film to a heat treatment, and a step of forming a second electrode.

18. A process for producing a photoelectric conversion device comprising, a step of forming a first electrode, a step of forming a first microcrystalline semiconductor film without adding an n type or p type impurity element, a step of forming an intrinsic amorphous semiconductor a step of forming a second microcrystalline semiconductor film without adding an n type or p type impurity element, a step of injecting a p type impurity element to said second microcrystalline semiconductor film, and vicinity of a boundary between said second microcrystalline semiconductor film and said intrinsic amorphous semiconductor film, a step of subjecting said first and second microcrystalline semiconductor films and said intrinsic amorphous semiconductor film to a heat treatment, and a step of forming a second electrode.

19. A process for producing a photoelectric conversion device comprising, a step of forming a first electrode, a step of forming a second microcrystalline semiconductor film without adding an n type or p type impurity element, a step of injecting a p type impurity element to said second microcrystalline semiconductor film, a step of forming an intrinsic amorphous semiconductor film, a step of forming a first microcrystalline semiconductor film without adding an n type or p type impurity element, a step of subjecting said first and second microcrystalline semiconductor films and said intrinsic amorphous semiconductor film to a heat treatment, and a step of forming a second electrode.

20. A process for producing a photoelectric conversion device as claimed in claim 17, 18 or 19, wherein said first and second microcrystalline semiconductor films are microcrystalline silicon films, and said intrinsic amorphous semiconductor film is an amorphous silicon film.

21. A process for producing a photoelectric conversion device as claimed in claim 1, 2, 3, 4, 5, 7, 8, 9, 17, 18 or 19, wherein said first and second microcrystalline semiconductor films are microcrystalline silicon films, and said intrinsic amorphous semiconductor film is an amorphous semiconductor film comprising plural elements selected from carbon, silicon, germanium and tin, as constitutional elements.

22. A process for producing a photoelectric conversion device as claimed, in claim 1, 2, 8 or 9, wherein said second electrode is a light transmissible electrode comprising one or plural materials selected from $In_2O_3$, $SnO_2$ and ZnO.

23. A process for producing a photoelectric conversion device as claimed in claim 17, 18 or 19, wherein said first and second microcrystalline semiconductor films and said intrinsic semiconductor film are formed by a plasma CVD method.

24. A process for producing a photoelectric conversion device as claimed in claim 17, 18 or 19, wherein said first and second microcrystalline semiconductor films and said intrinsic semiconductor film are formed with one glow discharge plasma generation means provided in one reaction chamber.

25. A process for producing a photoelectric conversion device as claimed in claim 1, 2, 3, 4, 5, 7, 8, 9, 17, 18 or 19, wherein said step of injecting a p type impurity element into said second microcrystalline semiconductor film is an ion doping method.

26. A process for producing a photoelectric conversion device as claimed in claim 1, 2, 3, 4, 5, 7, 8, 9, 17, 18 or 19, wherein said step of injecting a p type impurity element into said second microcrystalline semiconductor film is an ion doping method, wherein said type impurity element is one or plural elements selected from B, Al, Ga and In.

27. A process for producing a photoelectric conversion device as claimed in claim 17, 18 or 19, wherein a temperature of said heat treatment is from 200 to 450° C.

28. A process for producing a photoelectric conversion device as claimed in claim 1, 2, 3, 4, 5, 7, 8, 9, 17, 18 or 19, wherein said step of injecting a p type impurity element into said second microcrystalline semiconductor film is an ion doping method, wherein a dose amount of said p type impurity element is from $2.0 \times 10^{13}$ per square centimeter to $5.0 \times 10^{15}$ per square centimeter.

29. A process for producing a photoelectric conversion device as claimed in claim 1, 2, 3, 4, 5, 7, 8 or 9, wherein a temperature of heating said first microcrystalline semiconductor film and said second microcrystalline semiconductor film is from 150 to 450° C.

30. A process for producing a photoelectric conversion device as claimed in claim 8 or 9, wherein said organic resin substrate comprises an organic resin selected from polyethyleneterephthalate, polyethylenenaphthalate, polyethersulfone, polyimide and aramid.

31. A process for producing a solar cell comprising a process as claimed in claim 1, 2, 3, 4, 5, 7, 8, 9, 17, 18 or 19.

32. A process for producing an image sensor comprising a process as claimed in claim 1, 2, 3, 4, 5, 7, 8, 9, 17, 18 or 19.

33. A process for producing a photo sensor comprising a process as claimed in claim 1, 2, 3, 4, 5, 7, 8, 9, 17, 18 or 19.

* * * * *